(12) United States Patent
Tran et al.

(10) Patent No.: US 6,584,029 B2
(45) Date of Patent: Jun. 24, 2003

(54) ONE-TIME PROGRAMMABLE MEMORY USING FUSE/ANTI-FUSE AND VERTICALLY ORIENTED FUSE UNIT MEMORY CELLS

(75) Inventors: Lung T. Tran, Saratoga, CA (US); Thomas C. Anthony, Sunnyvale, CA (US); Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/924,577

(22) Filed: Aug. 9, 2001

(65) Prior Publication Data

US 2003/0031074 A1 Feb. 13, 2003

(51) Int. Cl.[7] .................................................. G11C 7/00
(52) U.S. Cl. ...................................... 365/225.7; 365/69
(58) Field of Search ................................. 365/225.7, 69

(56) References Cited

U.S. PATENT DOCUMENTS

| | | | |
|---|---|---|---|
| 5,311,053 A | * | 5/1994 | Law et al. ................... 257/529 |
| 5,684,732 A | | 11/1997 | Sako ............................ 365/96 |
| 6,154,851 A | * | 11/2000 | Sher et al. ...................... 714/5 |
| 6,339,559 B1 | * | 1/2002 | Bertin et al. ............. 365/225.7 |
| 6,438,059 B2 | * | 8/2002 | Akita et al. .............. 365/225.7 |

\* cited by examiner

Primary Examiner—M. Tran

(57) ABSTRACT

A one-time programmable ("OTP") memory includes one or more memory arrays stacked on top of each other. The OTP memory array is a cross-point array where unit memory cells are formed at the cross-points. The unit memory cell may include a fuse and an anti-fuse in series with each other or may include a vertically oriented fuse. Programming the memory may include the steps of selecting unit memory cells, applying a writing voltage such that critical voltage drop across the selected cells occur. This causes the anti-fuse of the cell to break down to a low resistance. The low resistance of the anti-fuse causes a high current pulse to be delivered to the fuse, which in turn melts the fuse to an open state. Reading the memory may include the steps of selecting unit memory cells for reading, applying a reading voltage to the selected memory cells and measuring whether current is present or not. Equipotential sensing may be used to read the memory.

35 Claims, 22 Drawing Sheets

RESISTANCE OF ANTI-FUSE

RESISTANCE OF FUSE

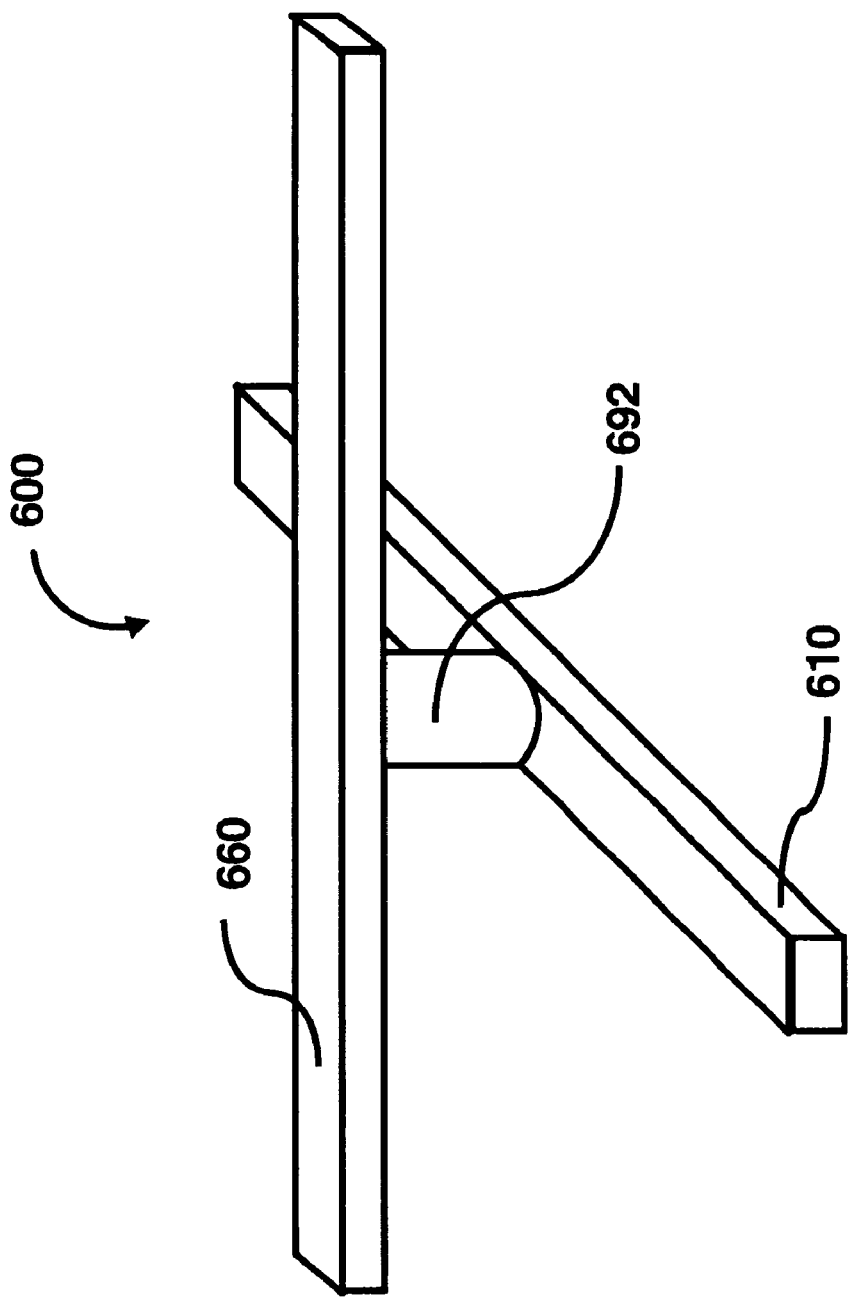

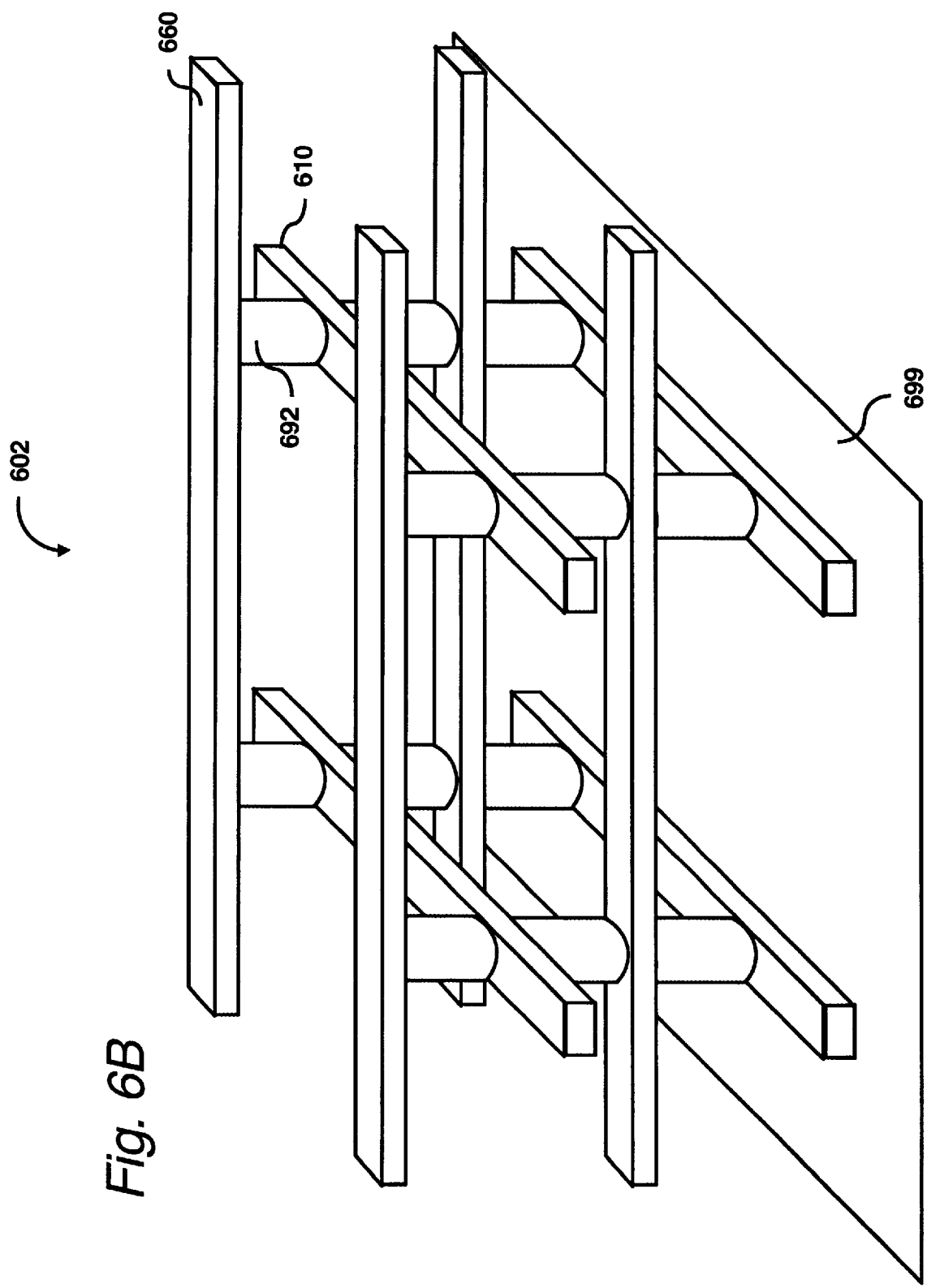

ONE-TIME PROGRAMMABLE MEMORY USING FUSE/ANTI-FUSE AND VERTICALLY ORIENTED FUSE UNIT MEMORY CELLS

RELATED APPLICATIONS

The following applications of the common assignee may contain some common disclosure and may relate to the invention:

U.S. patent application Ser. No. 09/964,770, entitled "VERTICALLY ORIENTED NANO-FUSE AND NANO-RESISTOR CIRCUIT ELEMENTS";

U.S. patent application Ser. No. 09/964,768, entitled "ONE-TIME PROGRAMMABLE FUSE/ANTI-FUSE COMBINATION MEMORY CELL"; and U.S. patent application Ser. No. 09/924,500, entitled "ONE-TIME PROGRAMMABLE VERTICALLY ORIENTED FUSE AND VERTICALLY ORIENTED FUSE/DIODE UNIT MEMORY CELL AND ONE-TIME PROGRAMMABLE MEMORY USING THE SAME".

FIELD OF THE INVENTION

This invention relates generally to programmable memory storage devices. More particularly, the invention relates to a one-time programmable storage device with vertically oriented fuse or with fuse and anti-fuse combination unit memory cells.

BACKGROUND OF THE INVENTION

The demand for semiconductor devices has increased dramatically in recent years as evidenced by the pervasiveness of consumer electronic devices. Most or all consumer electronics are possible because of developments in semiconductor devices. As the electronic devices become smaller, more sophisticated, and less expensive, the demand for highly dense semiconductor devices at a lower cost is increasing.

In the field of memories, the demand for ever increasing densities and lower cost is particularly true, especially for non-volatile memories, i.e., those memories that do not lose data even when power is not supplied.

A non-volatile memory may be a one-time programmable ("OTP") or re-programmable. As the name suggests, OTP memory is programmed once, and it is permanent for all practical purposes. Most OTP memories can be categorized into four basic types: 1) anti-fuse, 2) fuse, 3) charge storage (EPROM), and 4) mask ROM.

Programmable elements based on an anti-fuse typically rely on breakdown of metal-insulator-metal or diode structures to create the two resistance states. Programming voltages in excess of 10 V are generally required. In addition, the current required for anti-fuse breakdown can be large, which leads to large drive transistors. If used as a memory cell, an access transistor is typically included in the memory cell.

Memory cells based on a fuse storage element are not widely used due to the large cell size. A planar fuse requires a minimum area of $8\lambda^2$ (where $\lambda$ is the minimum photolithographic feature size), since a contact region is needed on each end of the fuse. Generally the fuse is even larger than $8\lambda^2$ to provide a more readily programmed element. As for the anti-fuse, the programming current can be large, which leads to large drive transistors as mentioned above. Adding an access transistor increases the minimum cell size even further.

In the case of EPROM, programming the bit requires a high write voltage to transfer charge from the substrate to the floating gate of the memory cell by Fowler-Nordheim electron tunneling. Write speed is limited by the tunneling current density. EPROM is unique within the OTP memory family in that it can be reprogrammed, but it has to be erased first by exposing the memory array to a ultra-violet light source. This procedure is not easily implemented and the entire memory is erased.

A mask read only memory ("mask ROM") is a memory that is programmed at the time of fabrication, and thus is a type of an OTP memory. A mask ROM is relatively simpler since the circuit to enable writing is not needed, and thus is less costly when compared to other OTP memories. Because the programming is part of the fabrication process, the mask ROM cannot be "field programmed", i.e., programmed by the purchaser to fit the particular needs of the purchaser. In other words, mask ROMs do not provide the flexibility of field programmability. Also, unless the mask ROMs are manufactured in bulk, cost savings cannot generally be realized.

Existing OTP memory technologies described above are based on cell sizes considerably larger than $4\lambda^2$, the minimum cell size for a cross-point memory. In addition, in each case the memory cell consists of a single plane of memory elements constructed on a single crystal silicon substrate, with the sense and programming electronics located around the periphery of the memory array. Consequently, high density, low cost OTP memories are difficult to fabricate.

SUMMARY OF THE INVENTION

In accordance with an aspect of the invention, a one-time programmable ("OTP") memory may include one or more memory arrays. Each memory array may include one or more row conductors extending in a row direction and one or more column conductors extending in a column direction such that a cross-point is formed at intersections between the row and column conductors. The memory array may also include a state element formed in at least one cross-point. The state element may include a fuse and may additionally include an anti-fuse in series with the fuse. The state element is in electrical contact with the row and column conductors.

In accordance with another aspect of the principles of the invention, a method of programming an OTP memory may include the steps of selecting a state element, applying a writing voltage $V_{WR}$ to a row conductor electrically connected to the selected state element, and grounding a column conductor electrically connected to the selected state element. By applying voltage $V_{WR}$ to the row conductor and grounding the column conductor, a critical voltage drop $V_C$ occurs through the selected state element causing the state element to change states.

In accordance with yet another aspect of the principles of the invention, a method of reading an OTP memory may include the steps of selecting a state element, applying a reading voltage $V_{RD}$ to a row conductor electrically connected to the selected state element, and sensing an amount of current from a column conductor electrically connected to the selected state element. Sensing a relatively high current indicates that the state element is in a first state (a low resistance state) and sensing a relatively low current indicates that the state element is in a second state (a high resistance state).

Certain advantages follow from certain embodiments of the invention. For example, the size of individual unit memory cell is dramatically reduced. This enables providing a high density OTP memory cell at much lower cost. Also, the unit memory cells may be fabricated using standard semiconductor processes and materials, and thus, little to no capital investment is required beyond that present in the current state-of-the-art manufacturing. Further, the current flow in the memory cells is substantially perpendicular (vertical) to the substrate plane. This allows the cells to be inserted between adjacent conductors. In particular, the cells can be placed at an intersection of a cross-point array of conductors to form a cross-point OTP memory array. The cross-point memory arrays can be fabricated such that the planar area of each memory cell is $4\lambda^2$. Planes of these arrays can be stacked on top of one another, which increases the density dramatically.

BRIEF DESCRIPTION OF THE DRAWINGS

Features and advantages of the invention will become apparent to those skilled in the art from the following description with reference to the drawings, in which:

FIG. 6A illustrates a simplified three-dimensional perspective of a unit memory cell of a memory array according to an aspect of the invention;

FIGS. 6B–6C illustrate simplified three-dimensional perspectives of stacked memory arrays using the unit memory cells according to an aspect of the invention;

DETAILED DESCRIPTION

For simplicity and illustrative purposes, the principles of the invention are described by referring mainly to exemplary embodiments thereof. However, one of ordinary skill in the art would readily recognize that the same principles are equally applicable to many types of one-time programmable (OTP) memories and methods of using thereof.

In general, an OTP memory is formed using one or more cross-point memory arrays, and the memory arrays are formed using unit memory cells. A unit memory cell, according to certain aspects of the invention, is located at a cross-point of two conductors. A first type of unit memory cell generally includes a fuse in series with an anti-fuse. The anti-fuse is an element that has an initial high resistance and breaks downs to a relatively low resistance when a critical voltage is applied.

Figure 1A:
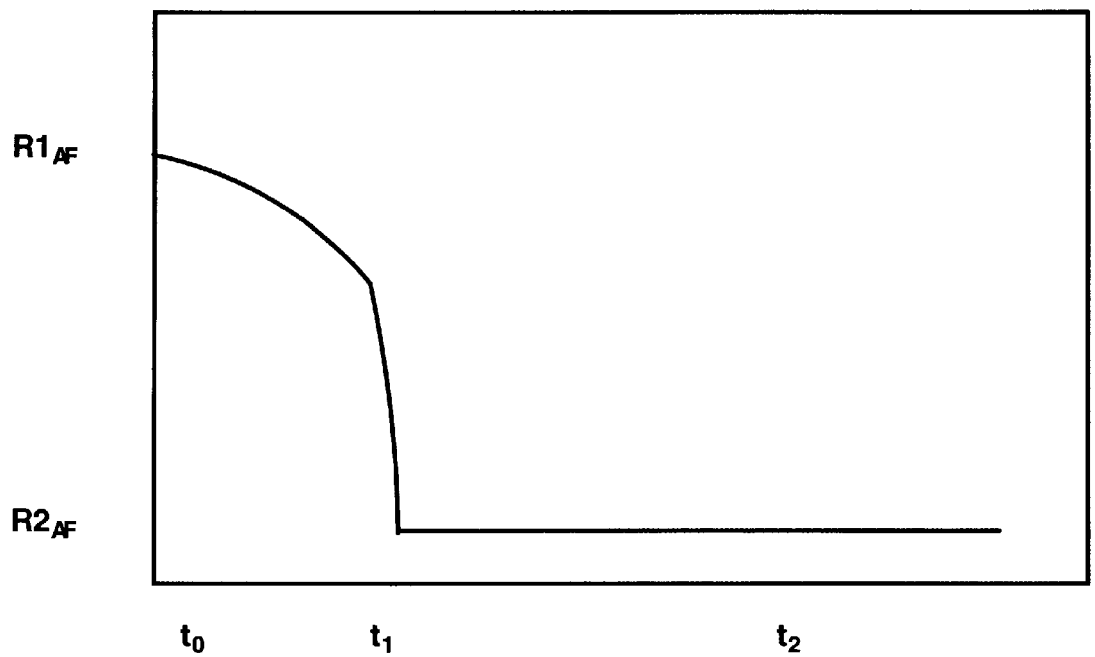
FIG. 1A illustrates a resistance characteristic of an exemplary anti-fuse according to an aspect of the invention.

FIG. 1A illustrates a resistance characteristic of an exemplary anti-fuse. As shown, the anti-fuse has an initial high resistance $R1_{AF}$. When a critical voltage $V_C$ is applied at time $t_0$, current begins to flow through the anti-fuse. At time $t_1$, the anti-fuse breaks down to a relatively low resistance $R2_{AF}$. If the voltage $V_C$ continues to be applied, a large current flows through the anti-fuse after time $t_1$.

An anti-fuse can be formed from insulator materials, a multi-layer stack of insulator materials separated by conducting materials, a matrix of insulating material containing dispersed conductive inclusions, amorphous and crystalline semiconductor materials, phase change materials, combinations of a multi-layer stack of Si and silicide-forming metals, etc. Generally, the anti-fuse is sandwiched between two conducting materials to enable applications of voltage across the anti-fuse. Insulator materials include $SiO_x$, $SiN_x$, $SiO_xN_y$, $AlO_x$, $TaO_x$, $TiO_x$, $AlN_x$ and the like; amorphous and crystalline semiconductor materials include Si, Ge, alloys of Si and Ge, InTe, SbTe, GaAs, InSe, InSb, and the like; phase change materials include alloys containing at least two elements selected from Si, Ge, As, Se, In, Sn, Sb, Te, Pb, Bi, and the like; silicide-forming metals include W, Pt, Pd, Co, Ni, Ti, and the like and alloys thereof.

If insulator materials are used as the anti-fuse, then the thickness of the anti-fuse is preferably between 0.5 nanometer (nm) and 50 nm. However, the thickness may be set to an arbitrary range depending on the circumstances. For instance, if appreciable current flow is desired through the anti-fuse in a pre-breakdown condition, then the insulator thickness may be chosen to be less than about 5 nm so that significant quantum mechanical tunneling current can flow at a modest voltage. If amorphous and polycrystalline semiconductor materials are used, the thickness is preferably between 1 nm and 100 nm. Again, the thickness may be varied.

As noted above, the anti-fuse is an element that has an initial high resistance and changes to a relatively low resistance when a critical voltage is applied. The mechanism that achieves the different resistive states is different for different materials. For example, anti-fuses formed from phase change materials have a high resistance when in an amorphous state and a low resistance when in a crystalline state. Also, anti-fuses formed from multi-layer Si and silicide-forming metals have a high resistance when the multi-layer has not been converted to silicide and a low resistance when the multi-layer has been converted to the silicide. In both cases, many orders of magnitude separate the high and low resistance states.

As another example, if an insulator type of anti-fuse is used, up to the critical voltage $V_C$, current passes through the insulating barrier of the metal-insulator-metal structure by electron tunneling, and the specific resistance of the cell can be rather large, for example, on the order of $10^7$ $\Omega$-$\mu m^2$. However, beyond the critical voltage $V_C$, the barrier breaks down due to metal migration through the insulator, and the specific resistance of the cell can drop to below 100 $\Omega$-$\mu m^2$. Similar current transport and breakdown mechanisms are operative in layered insulators and insulators containing conductive inclusions.

Unlike the anti-fuse, the fuse is an element that has an initial low resistance and changes to a high resistance, mostly to an open circuit when a critical current is applied. The fuse may be a thin film resistor, and may be formed from materials such as semiconductors (e.g. Si, Ge), conductors (e.g. Al, Cu, Ag, Au, Pt), low melting material (e.g. In, Zn, Sn, Pb), refractory metals (e.g. Ta, W), transition metals (Ni, Cr) and the like and any alloys thereof. It is even more beneficial if the fuse is vertically oriented, i.e. the direction of the current flow is substantially vertical within the fuse, since very small memory elements can be achieved with vertically oriented fuses.

Figure 1B:
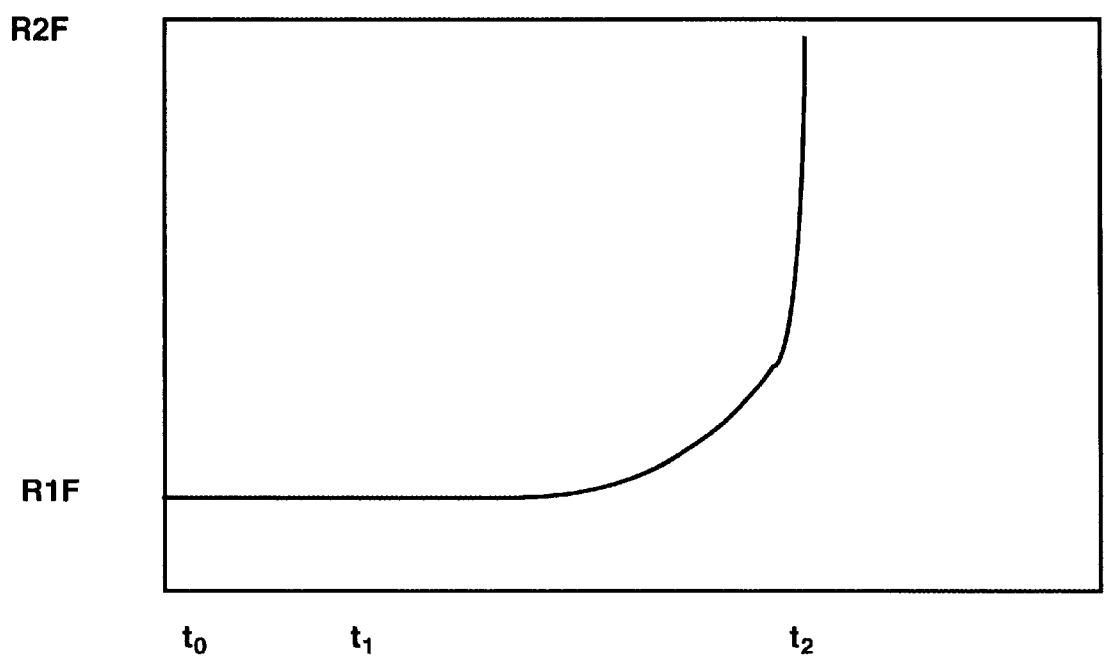
FIG. 1B illustrates a resistance characteristic of an exemplary fuse according to an aspect of the invention.

FIG. 1B illustrates a resistance characteristic of an exemplary fuse. As shown, the fuse has an initial low resistance $R1_F$. The fuse maintains the low resistance until a critical current $I_C$ is initiated at time $t_1$. At this point, $I^2Rt$ heating causes the temperature of the fuse to increase, leading to thermal runaway; i.e. the continued dissipation of power through the fuse leads to additional heating, which leads to further increase in temperature, and so on. Eventually the $I^2Rt$ heating causes the fuse to melt and become an open circuit $R2_F$ at time $t_2$. Thus, the memory cell with a fuse exhibits two states. The first, or initial, state is resistance $R1_F$, which can be controlled to a specified value through the choice of fuse materials and geometry. The second, or final state is $R2_F$, an open-circuit.

A memory made of the first type (fuse/anti-fuse in series) of unit memory cells may be programmed by either applying a critical current, $I_C$, to those cells in which the second state is desired and leaving those cells alone in which the first state is desired. Applying a read voltage $V_R$ and sensing a presence or absence of electrical current through the selected memory cell may detect the first and second states of an individual unit memory cell. Presence of current indicates that the memory cell is in the first state and absence of current indicates that the memory cell is in the second state.

Figure 1C:
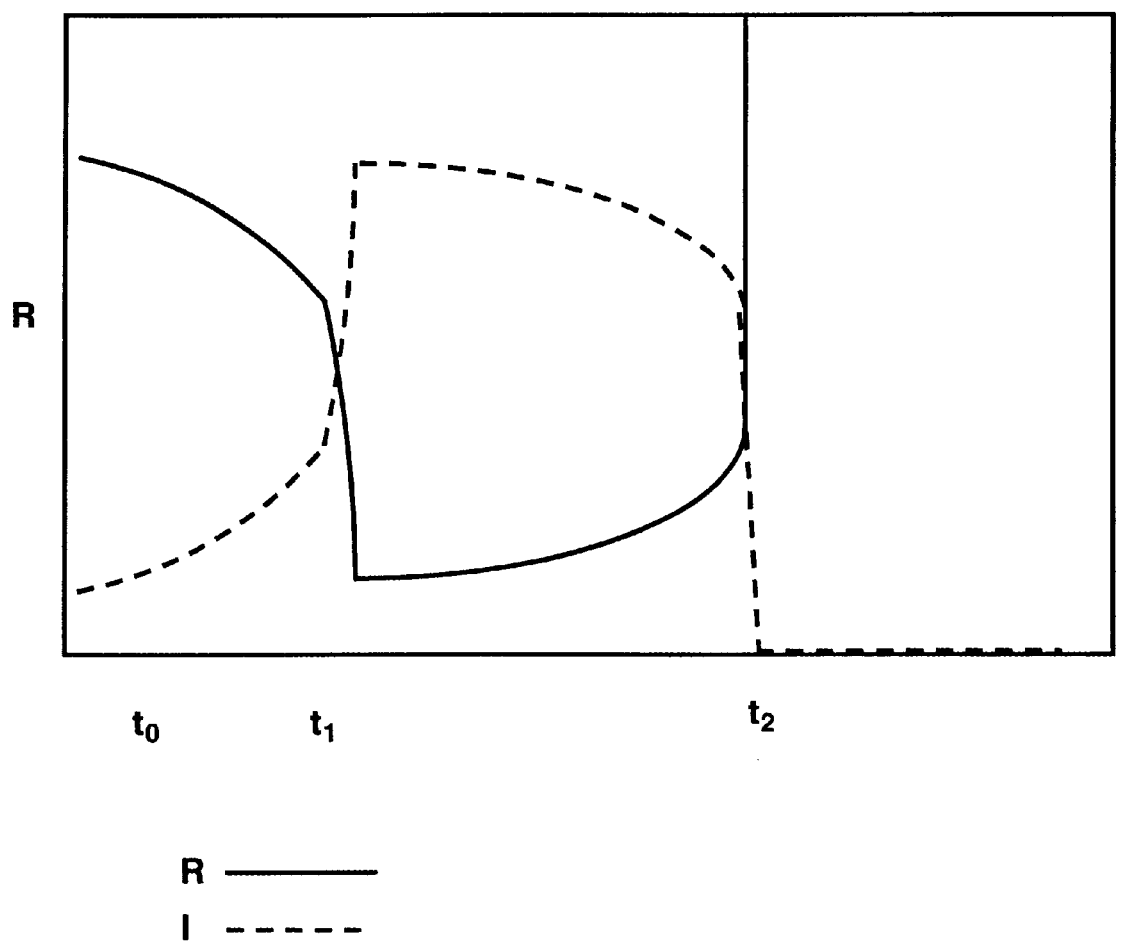
FIG. 1C illustrates the resistance and current characteristic of an exemplary fuse/anti-fuse series combination used in a unit memory cell according to an aspect of the invention.

FIG. 1C illustrates a resistance (shown in solid line) and current (shown in dashed line) characteristics of an exemplary fuse/anti-fuse series combination. Initially, the high resistance $R1_{AF}$ of the anti-fuse is dominant. However, when sufficiently large voltage, i.e. $V_C$, is applied at time to, the anti-fuse breaks down at time $t_1$ as explained previously. At this point, both the fuse and the anti-fuse are low in resistance as shown by the sharp drop in the resistance line around time $t_1$. Due to the low resistance, current passing through the fuse/anti-fuse combination becomes critical, i.e. critical current $I_C$ is generated. This melts the fuse as discussed previously. The thermal runaway process causes the temperature to increase until finally the fuse breaks and becomes an open circuit at time $t_2$. At this point, the fuse and anti-fuse combined resistance is the open circuit $R2_F$ resistance. Correspondingly, the current becomes zero at time $t_2$ as shown by the dashed lines in FIG. 1C.

Thus the memory cell with the fuse and anti-fuse in series exhibits two states. The first state, or the initial state, exhibits a finite resistance (generally dominated by $R1_{AF}$). In this first state, some amount of current may flow since the resistance is finite. The second state exhibits an infinite resistance (an open circuit $R2_F$). As a result, no current may flow across the cell (see the dashed line in FIG. 1C).

Programming and reading such a memory cell becomes a relatively simple task. If the first state is desired, the memory cell may be left alone. If the second state is desired, then a critical voltage $V_C$ may be applied to the memory cell. Also the time between $t_0$ and $t_2$ may be extremely short. This allows rapid programming to take place.

It should be noted that an anti-fuse is not strictly necessary for the memory cell. However, in a cross-point memory array that does not include a diode or transistor in series with the memory cell, the anti-fuse provides selectivity for programming a particular memory cell. Also the high initial resistance of the anti-fuse allows the individual resistance of the fuse to be reduced to an arbitrary value without jeopardizing the ability to sense an individual memory element in the array.

Figure 1D:
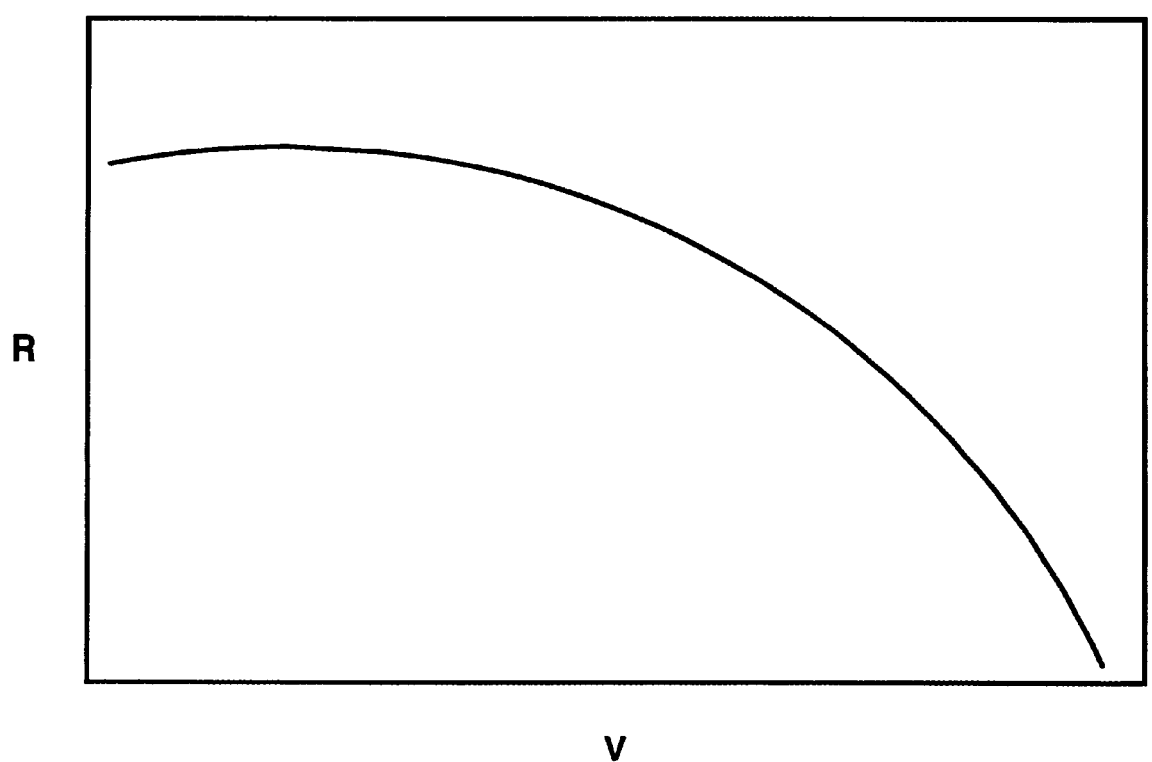
FIG. 1D illustrates the voltage-resistance characteristic of the anti-fuse.

In addition, resistance of the anti-fuse may vary with different levels of the applied voltage. This characteristic can be used to enhance the memory cell selectivity function that an anti-fuse provides in memory devices. As seen in FIG. 1D, the resistance of a thin insulator type anti-fuse (metal/insulator/metal tunnel junction) is shown to generally decrease as the voltage across the anti-fuse increases. Thus by controlling the voltage across the anti-fuse, the effective resistance of the unit memory cell can be controlled as well. Note that the resistance-voltage characteristic may be non-linear.

A second type of unit memory cell generally includes a vertically oriented fuse. Vertically oriented fuses have current flow that is vertical, i.e. perpendicular to the plane of the substrate. The vertically oriented fuses are manufactured such that a ratio of vertical height to lateral thickness of the fuse is at least 1, and is generally substantially greater than 1, perhaps as much as 30 to 1 or more, which again allows for high density memories to be fabricated.

Programming and reading a memory made of unit memory cells of the second type is also relatively straightforward. Like the memories made of first type of unit memory cells, programming a second type of memory cell is achieved by applying a critical voltage $V_C$ (not necessarily the same critical voltage related to the first type) to generate a critical current $I_C$ (again, not necessarily the same as the first type) to melt the fuse. Also, first and second states are determined by applying a reading voltage and detecting presence or absence of current.

As will be seen later, equipotential methods may be used to read data from memory devices made of either the first or the second type of unit memory cells.

Figure 2A:
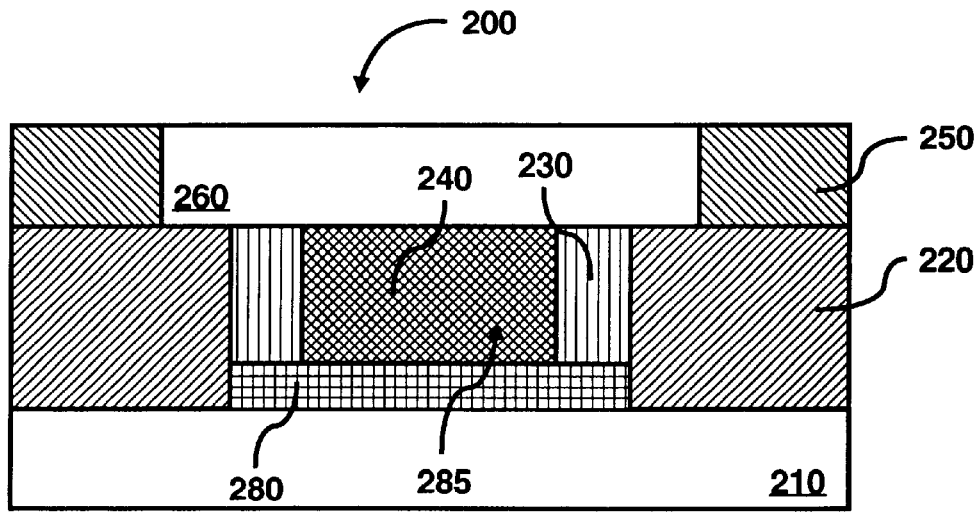
FIG. 2A illustrates a cross-sectional view of a first embodiment of a unit memory cell used as a basis to form an OTP memory according to an aspect of the invention.

FIG. 2A illustrates a cross-sectional view of a first embodiment of a unit memory cell 200 used as a basis to form an OTP memory according to an aspect of the invention. The unit memory cell 200, which is a first type of unit memory cell described above, includes a fuse 230 in series with an anti-fuse 280. The fuse and anti-fuse 230 and 280 are formed in a closed region 285.

In this particular embodiment, the fuse 230 is vertically oriented in relation to the substrate plane (not shown). In this manner, the current flow in the unit memory cell is also perpendicular (vertical) to the substrate plane. This allows memory cells to be inserted between adjacent conductor layers. In particular, the cells may be placed at an intersection of a cross-point array of conductors to form the cross-point memory array. Planes of these arrays can be stacked on top of one another, which increases the density of the OTP memory dramatically.

The unit memory cell 200 may also include a column conductor 210; a first insulator 220 situated above the column conductor 210 and defining the closed region 285; an insulating plug 240 occupying a center region of the closed region 285 from a top of the anti-fuse 280; a second insulator 250 and a row conductor 260, both situated above the first insulator 220, the fuse 230 and the insulating plug 240.

As noted above, the anti-fuse 280 may be formed from insulator materials, a multi-layer stack of insulator materials separated by conducting materials, a matrix of insulating material containing dispersed conductive inclusions, amorphous and crystalline semiconductor materials, phase change materials, combinations of a multi-layer stack of Si and silicide-forming metals, etc. To form the fuse 230, materials such as semiconductors, conductors, low melting temperature materials, refractory metals, transition metals and the like may be used.

To form the row and column conductors 260 and 210, conductive materials such as Al, Cu, Ag, Au, W, and the like and any alloys thereof can be used. Also, poly-silicon may be used for the row and column conductors 260 and 210. To form the first and second insulators 220 and 250 and the insulating plug 240, materials such as silicon oxides and nitrides, aluminum oxides and nitrides, silicon oxy-nitrides, tantalum oxides and the like may be used.

Although not shown, in certain embodiments, it may be desirable to etch away the insulating plug 240, wholly or partially, to leave a void. This configuration provides extremely low thermal conductivity adjacent to the fuse 230, and provides space for molten or evaporated fuse material to enter. These features lower the power necessary to break the fuse 230.

However, the insulating plug 240 does help to control the cross-sectional area of the fuse 230 in a plane parallel to the substrate plane, for example the area of the fuse 230 contacting the anti-fuse 280. Controlling the cross-sectional area allows the characteristics of the fuse, and thus the memory cell to be manipulated precisely.

While FIG. 2A shows that the row conductor 260 covers the entirety of the fuse 230 at the top of the closed region 285, this is not a requirement to practice the invention. Similarly, FIG. 2A also shows that the column conductor 210 covers the entirety of the anti-fuse 280 at the bottom of the closed region 285, but again, this is not a requirement. While complete coverage is shown, it is required only that a conductive path between the row and the column conductors 260 and 210 exists. Thus, electrical connections should exist among the column conductor 210, the fuse 230, the anti-fuse 280, and the row conductor 260. It is not necessary that the column conductor 210, the fuse 230, the anti-fuse 280, and the row conductor 260 be in physical contact with each other.

Figure 2B:
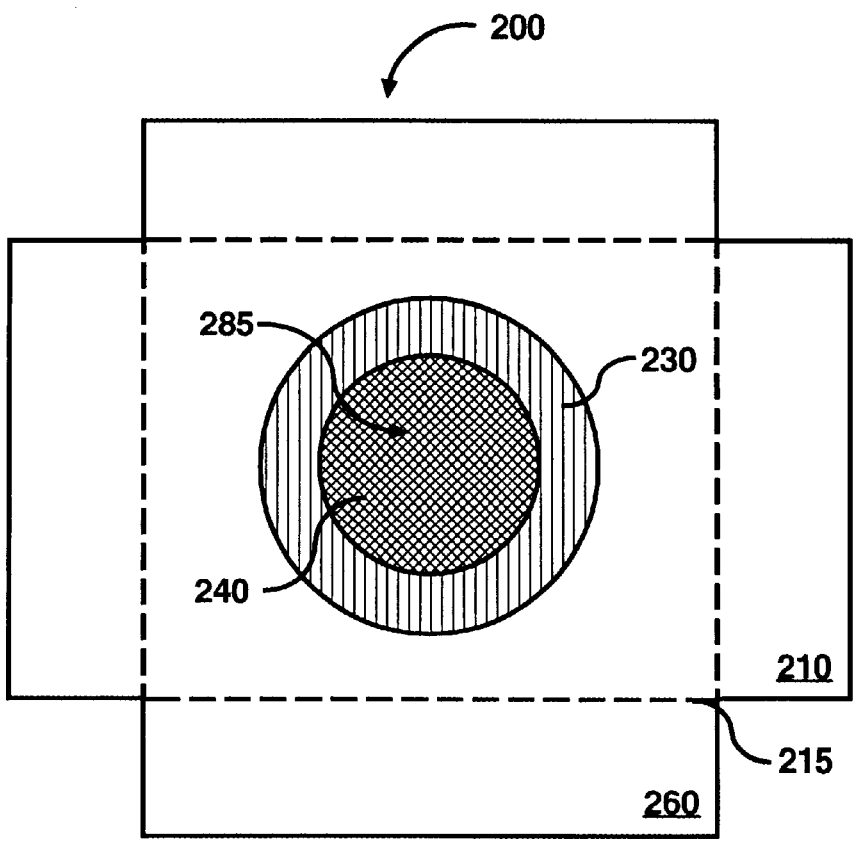
FIG. 2B illustrates a top view the unit memory cell of FIG. 2A showing the cross-point nature of the unit memory cell.

FIG. 2B illustrates a top view of the unit memory cell 200 of FIG. 2A showing the fuse 230 and the insulating plug 240 substantially occupying the edge and center of the closed region 285, which is located within the cross-point 115 of the row and column conductors 260 and 210. The anti-fuse 280 (not shown in FIG. 2B) may have the same shape as the insulating plug 240 and fuse 230, or it can extend beyond the fuse 230 and assume a different shape. The row and column conductors 260 and 210 extend in their respective directions to form the cross-point 215 (shown as a dashed line region for illustrative purposes). Even though the closed region 285 is shown to be entirely located within the cross-point 215, this is not strictly required. As noted above, it is only necessary that electrical connectivity be maintained between the row and column conductors 260 and 210 through the structure within the closed region 285.

For simplicity, the first and second insulators 220 and 250, respectively, are not included in FIG. 2B. Also, for illustrative purposes, the fuse 230 and the insulating plug 240 are shown at the cross point 215. However, the row conductor 260 may cover the entirety of the spacer 230 and the insulating plug 240.

Also, in FIG. 2B, the closed region 285 is shown as being cylindrical with the fuse 230 substantially occupying an annulus of the closed region 285 and the insulating plug 240 substantially occupying a center of the closed region 285. However, the shape of the closed region 285 is not so limited and may include other shapes as well, such as a rectangle, a square, an ellipse, or any other enclosed shape. Again, the insulating plug 240 may be partially or wholly etched away to leave a void.

Figure 2C:
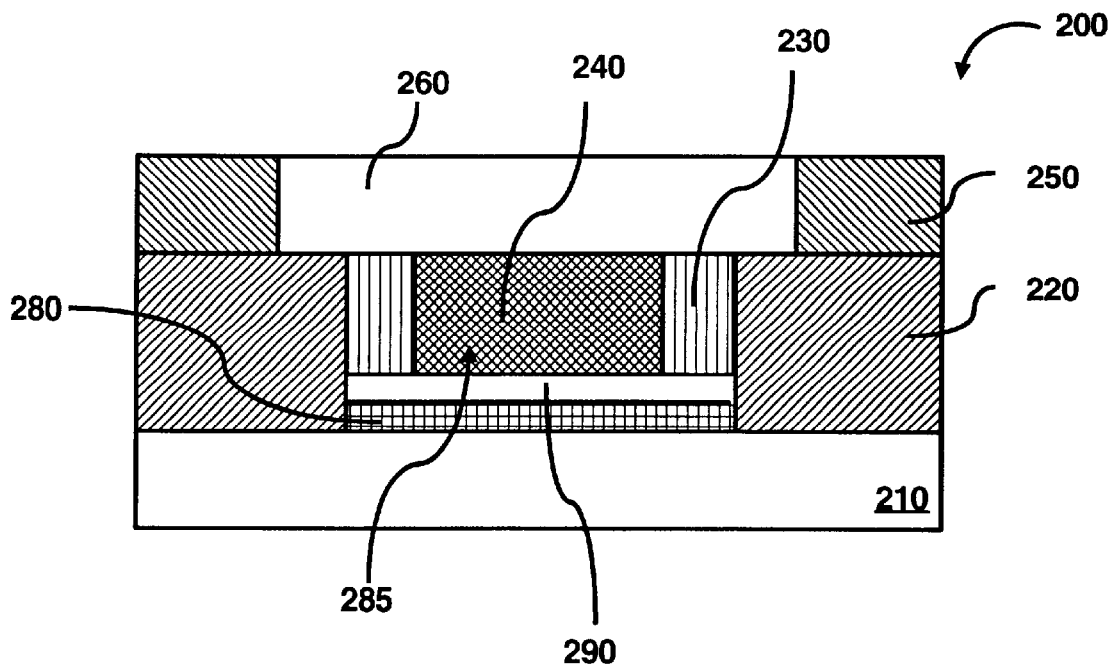
FIGS. 2C–2D illustrate variations on the unit memory cell of FIG. 2A according to aspects of the invention.
Figure 2D:
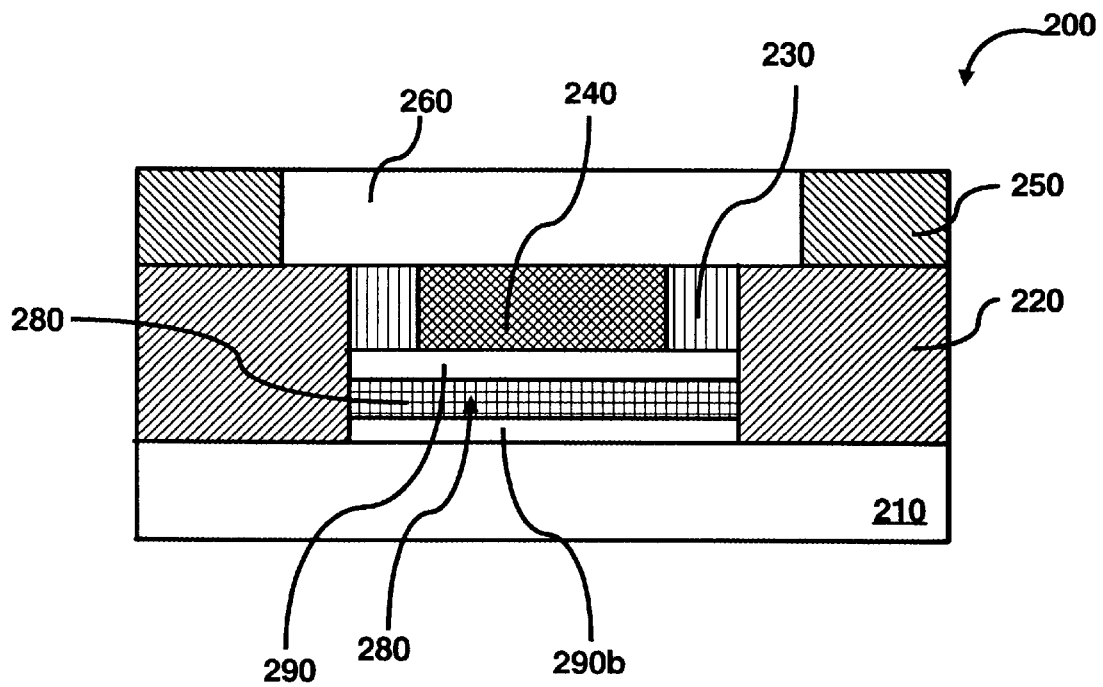

FIGS. 2C–2D illustrate variations on the first embodiment of FIG. 2A. In FIG. 2C, a thin conductor 290 may be placed as shown to enhance the performance of the memory cell 200. In FIG. 2D, two thin conductors 290 and 290b may be placed as shown for the same purpose. The thin conductors 290 and/or 290b enable independent control of the material adjacent to the anti-fuse 280 and provide a larger contact area between the fuse 230 and the anti-fuse 280. The thin conductors 290 and/or 290b may be a Schottky or ohmic contact to the anti-fuse 280, or the thin conductors 290 and/or 290b may be a thermal insulator to better thermally isolate the fuse 230. The thin conductors 290 and/or 290b may be formed of Al, Cu, Ni, Ti, W, W, metal nitrides, doped silicon, Ta, and the like and the alloys thereof.

In FIG. 2C, the thin conductor 290 is placed between the anti-fuse 280 and the fuse 230 in the closed region 285. If only a single thin conductor is to be included, this is the preferred placement in order to increase the area of the top surface of the anti-fuse 280. In FIG. 2D, the first thin conductor 290 is placed between the anti-fuse 280 and the fuse 230 as in FIG. 2C, but also includes a second thin conductor 290b placed between the column conductor 210 and the anti-fuse 280.

One reason to include thin conductors 290 and/or 290b is to introduce a material with lower thermal conductivity than present in the row or column conductors 260 or 210. A layer with low thermal conductivity may help to thermally isolate the memory cell from the row or column conductors 260 or 210. Thermal isolation provides for more efficient use of heat generated by $I^2Rt$ processes.

Using amorphous or crystalline semiconductors as the anti-fuse introduces additional reasons to include the thin conductors 290 and/or 290b. First, the choice of conductor material in contact with the semiconductor determines whether a rectifying or ohmic contact is formed. The nature of this contact may affect the function of the anti-fuse 280. Second, in certain semiconductor anti-fuses, the low resistance state is created by metal migration through the semiconductor layer. This process generally depends on the type of metal adjacent to the semiconductor. This provides flexibility in the choice of the conductors 210 and 260 and the metal layer adjacent to the semiconductor or anti-fuse, in this case, the thin conductors 290 and/or 290*b*.

While not shown, other placements of the thin conductors 290 and/or 290*b* are possible as long as electrical connectivity between the row and column conductors 260 and 210 is maintained.

Figure 3A:
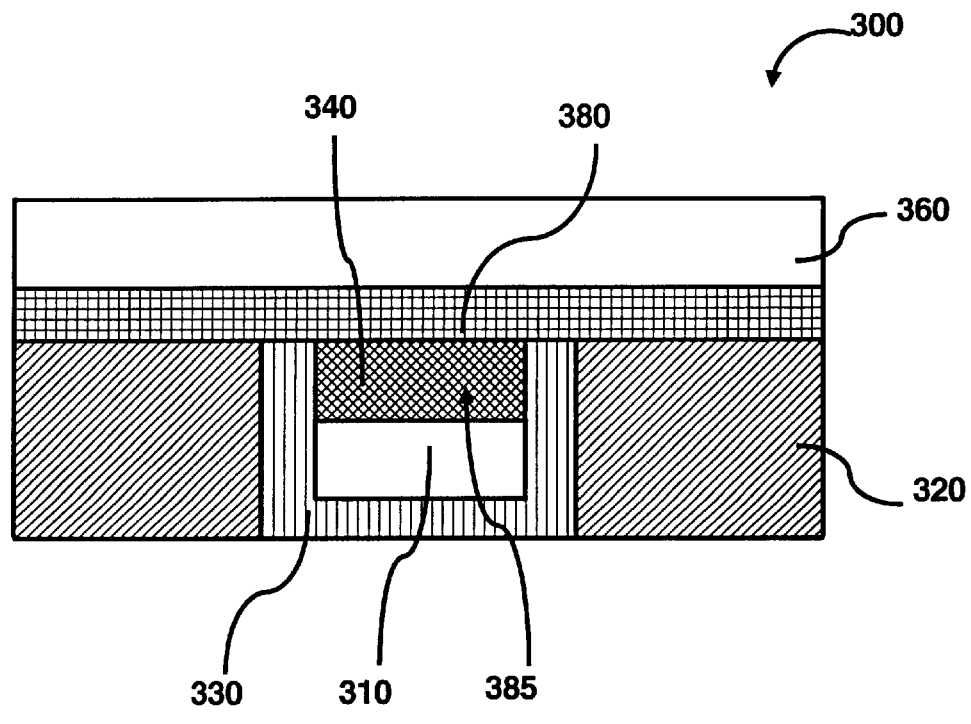
FIG. 3A illustrates a cross-sectional view of a second embodiment of a unit memory cell used as a basis to form an OTP memory according to an aspect of the invention.

FIG. 3A illustrates a cross-sectional view of a second embodiment of a unit memory cell 300 used as a basis to form an OTP memory according to an aspect of the invention. The unit memory cell 300, which is also a first type of unit memory cell, may include a fuse 330 and an insulator 320 formed on either side of the fuse 330. The interior of the fuse 330 may or may not be completely filled.

The cell 300 may also include a bottom conductor 310. Note that vertical portions of the fuse 330 and the bottom conductor 310 make up a 'U' region 385. In other words, the horizontal portion of the fuse 330 of FIG. 3A is not necessary to practice the invention as shown in FIG. 3D. The cell 300 may further include an insulating plug 340 occupying some or substantially most of the interior of the 'U' region 385. The cell 300 may still further include an anti-fuse 380 and a top conductor 360 above the above the 'U' region 385 and the insulator 320.

Materials used to form the various parts of the memory cell have been discussed above, and thus will not be repeated. Again, for reasons discussed before, the insulating plug 340 is not strictly necessary; a void may exist in the interior of the 'U' region 385.

Figure 3B:
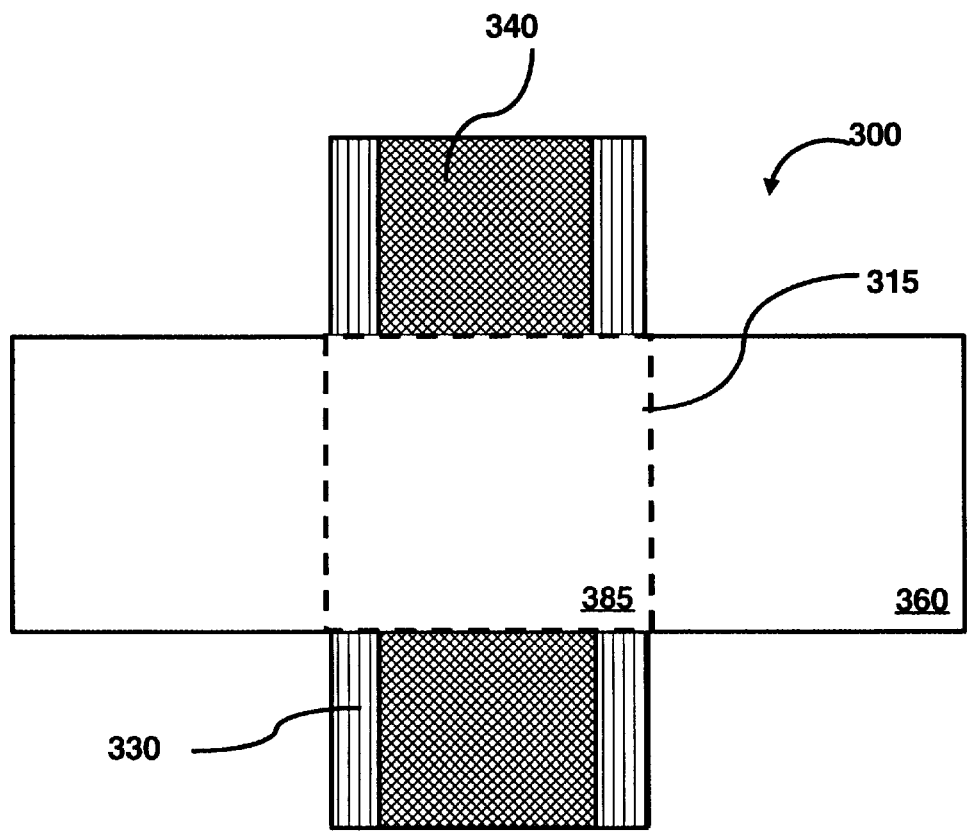
FIG. 3B illustrates a top view the unit memory cell of FIG. 3A showing the cross-point nature of the unit memory cell.

FIG. 3B illustrates a top view of the unit memory cell 300 of FIG. 3A. As shown, the row conductor 360 may extend in a row direction. Note that the anti-fuse 380 (not visible in FIG. 3B) may also extend in the row direction. The anti-fuse 380 may also extend in a column direction on top of the fuse 330 and insulating plug 340. Also, if the anti-fuse material 380' is an insulator, the anti-fuse 380 does not require patterning since it is by definition insulating in the plane of the film. The fuse 330, and thus the 'U' region 385, including the insulating plug 340 and the bottom conductor 310 (both not shown in FIG. 3B) may extend in the column direction and thereby defining a cross-point at the intersection.

Figure 3C:
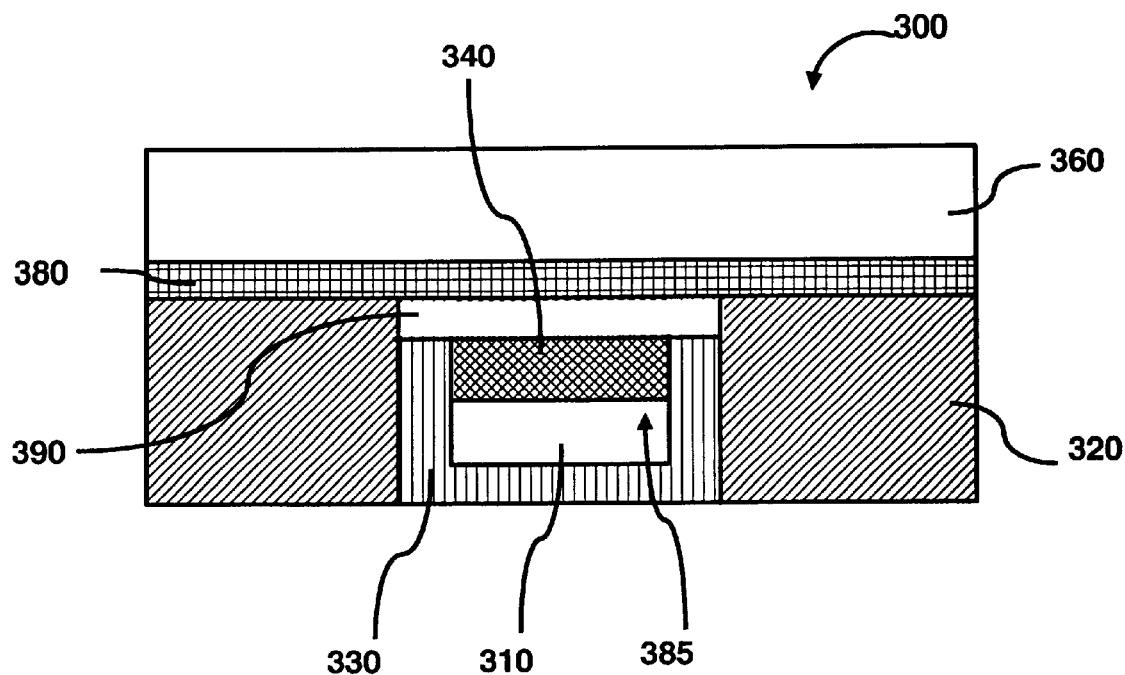
FIGS. 3C–3F illustrate variations on the unit memory cell of FIG. 3A.
Figure 3D:
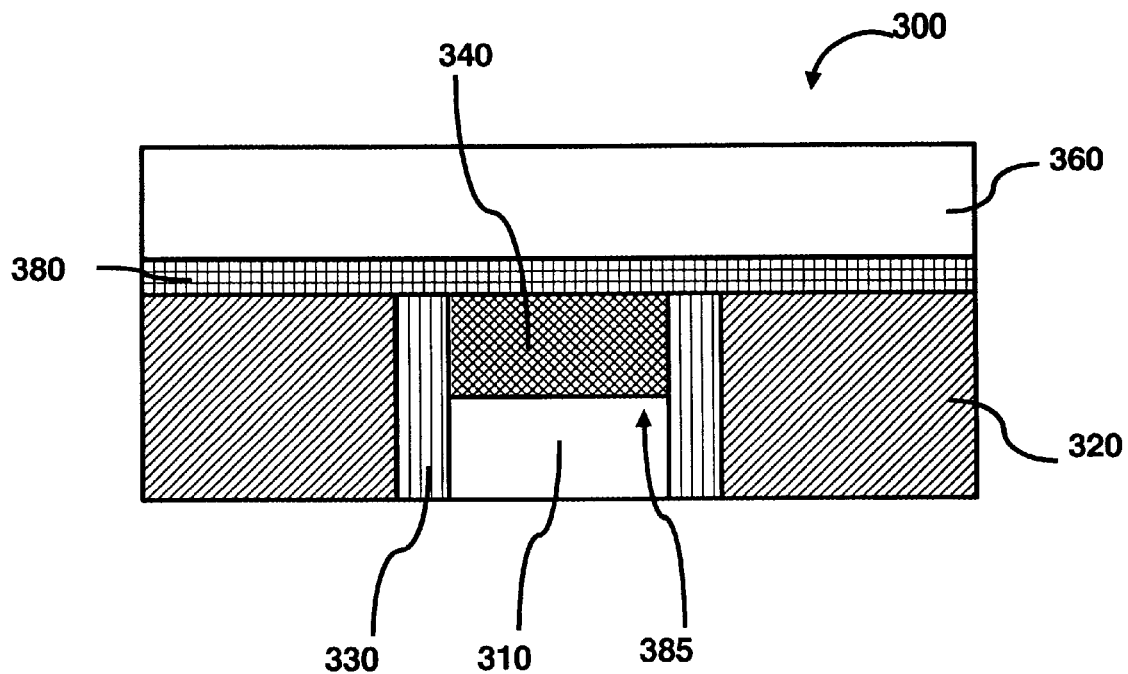

FIGS. 3C–3F illustrate variations on the unit memory cell 300 of FIG. 3A. In FIG. 3C, a thin conductor 390 may be placed between the fuse 330 and the anti-fuse 380 to enhance performance of the memory cell 300 as discussed previously with respect to the variations on the first embodiment. Note that the placement of the thin conductor 390 may be varied and is not limited to the placement as shown in FIG. 3C. However, the thin conductor 390 may be substantially limited to an area defined by a cross-point 315 as shown in FIG. 3B.

FIG. 3D, in addition to clarifying the 'U' region 385, also illustrates a variation on the unit memory cell 300 of FIG. 3A. As noted above, the horizontal portion of the fuse 330 is not necessary to practice the invention. FIG. 3D demonstrates this concept.

Figure 3E:
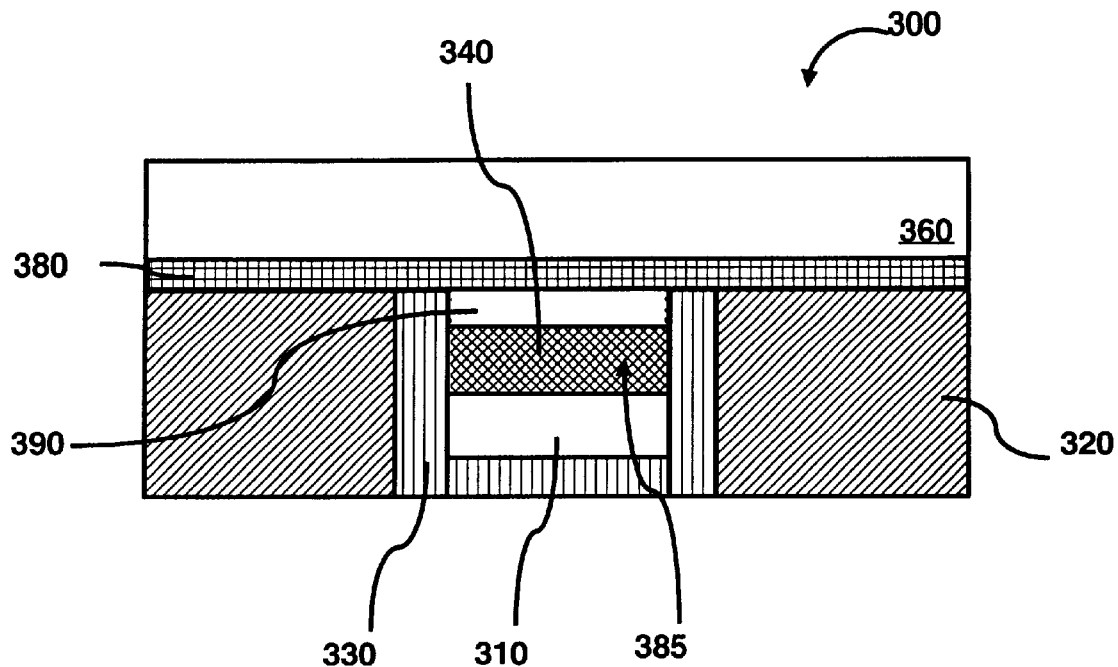

Further, FIG. 3E demonstrates that the thin conductor 390 need not cover the entirety of the 'U' region 385. In this variation, the thin conductor 330 is formed substantially within the interior of the 'U' region 385 and the fuse 330 is in contact with the anti-fuse 380. Note that many other variations are possible and are within the scope of the invention.

Figure 3F:
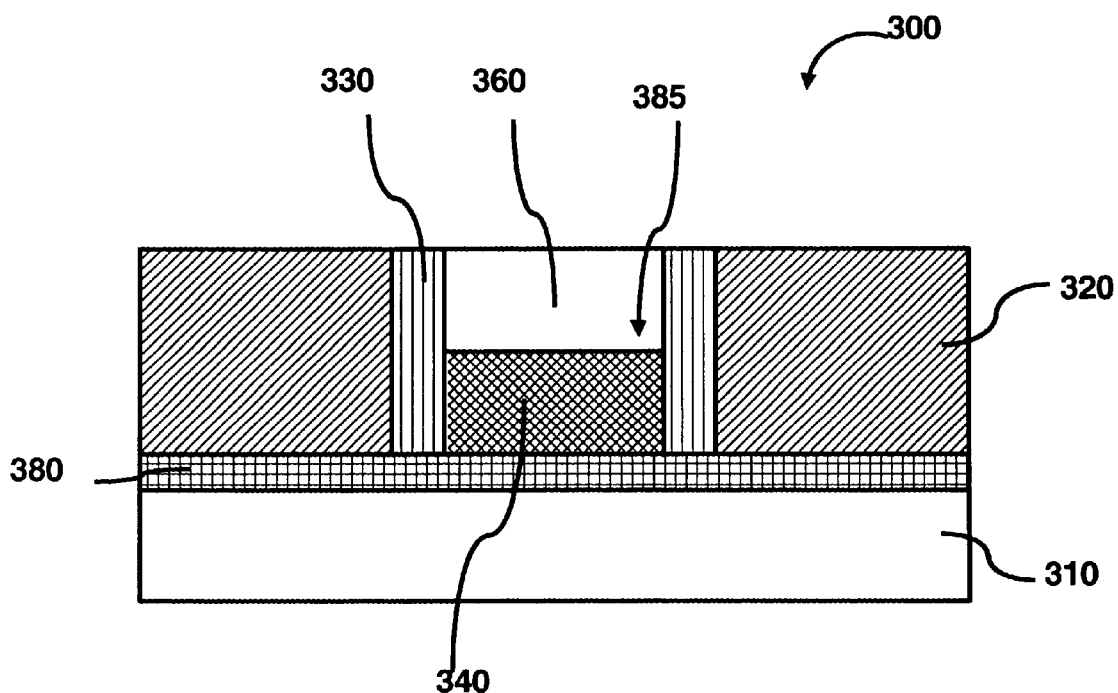

While the foregoing descriptions of the memory cell associated FIGS. 3A–3E indicate that the fuse 330, insulating plug 340, and 'U' region 385 extend in a second direction along with the bottom conductor 310, this orientation is not required to practice the present invention. Indeed, the fuse 330 can be associated with the top conductor 360 and extend in a first direction. In this case the vertical portions of the fuse 330 and the top conductor 360 now make up an inverted 'U' region 385. An insulating plug 340 can once again occupy some or substantially all of the inverted 'U' region 385. The memory cell 300 may still further include an anti-fuse 380 substantially occupying the bottom of the inverted 'U' region 385 above bottom conductor 310. An example of this alternate configuration is illustrated in FIG. 3F.

Figure 4A:
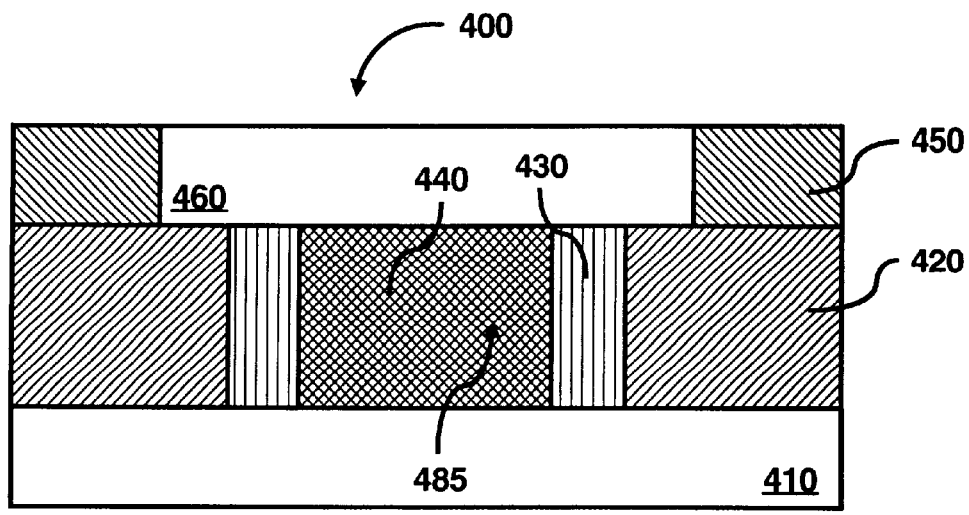
FIG. 4A illustrates a cross-sectional view of a third embodiment of a unit memory cell used as a basis to form an OTP memory according to an aspect of the invention.

FIG. 4A illustrates a cross-sectional view of a third embodiment of a unit memory cell 400 used as a basis to form an OTP memory according to an aspect of the invention. The unit memory cell 400, which is a second type of unit memory cell, includes a vertically oriented fuse 430. The vertically oriented fuse 430 is formed in a closed region 485.

The unit memory cell 400 may also include a column conductor 410; a first insulator 420 situated above the column conductor 410 and defining the closed region 485; an insulating plug 440 occupying a center region of the closed region 485; a second insulator 450 and a row conductor 460, both situated above the first insulator 420 and the vertically oriented fuse 430.

Again, the materials used to form the various parts of the memory cell have been discussed above. Also as discussed above, the insulating plug 440 is not strictly necessary. Like the first embodiment, complete coverage of the vertically oriented fuse 430 by the row conductor 460 is shown. But this is also not strictly necessary as long as the electrical connection between the top and bottom conductors 460 and 410 exist.

Figure 4B:
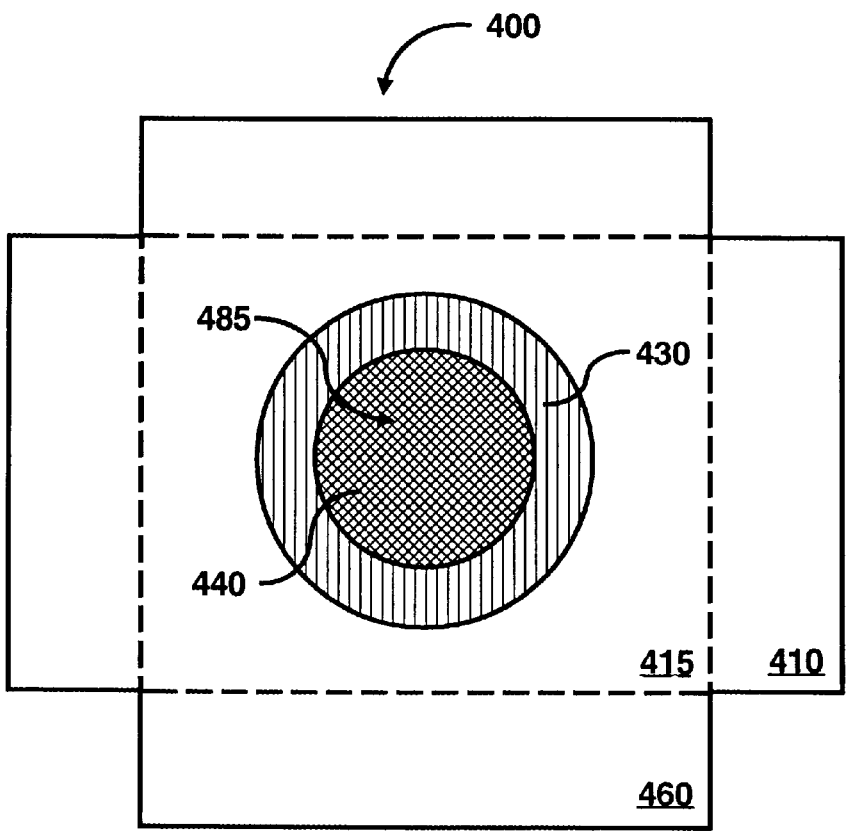
FIG. 4B illustrates a top view the unit memory cell of FIG. 3A showing the cross-point nature of the unit memory cell.

FIG. 4B illustrates a top view of the unit memory cell 400 of FIG. 4A showing the fuse 430 and the insulating plug 440 substantially occupying the edge and center of the closed region 485, which is located within the cross-point 415 of the row and column conductors 460 and 410.

Figure 5A:
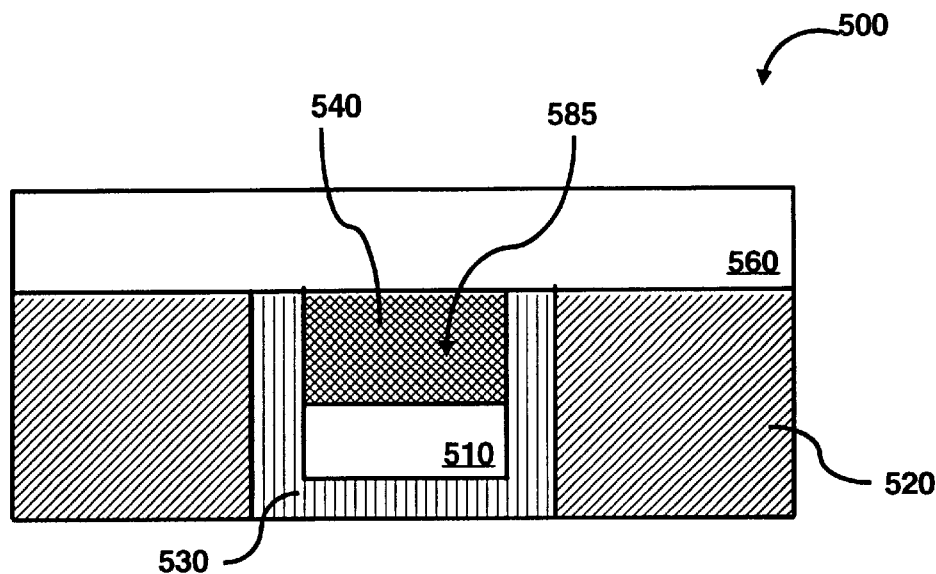
FIG. 5A illustrates a cross-sectional view of a fourth embodiment of a unit memory cell used as a basis to form an OTP memory according to an aspect of the invention.

FIG. 5A illustrates a cross-sectional view of a fourth embodiment of a unit memory cell 500 used as a basis to form an OTP memory according to an aspect of the invention. The unit memory cell 500, which is again a second type of unit memory cell, may include a vertically oriented fuse 530 and an insulator 520 formed on either side of the vertically oriented fuse 530. The interior of the vertically oriented fuse 530 may or may not be completely filled.

The cell 500 may also include a bottom conductor 510. Note that vertical portions of the vertically oriented fuse 530 and the bottom conductor 510 make up a 'U' region 585. In other words, the horizontal portion of the fuse 530 of FIG. 3A is not necessary to practice the invention. This is shown in FIG. 5C. The cell 500 may further include an insulating plug 540 occupying some or most of the interior of the 'U' region 585. The cell 500 may still further include a top conductor 560 above the above the 'U' region 585 and the insulator 520.

Figure 5B:
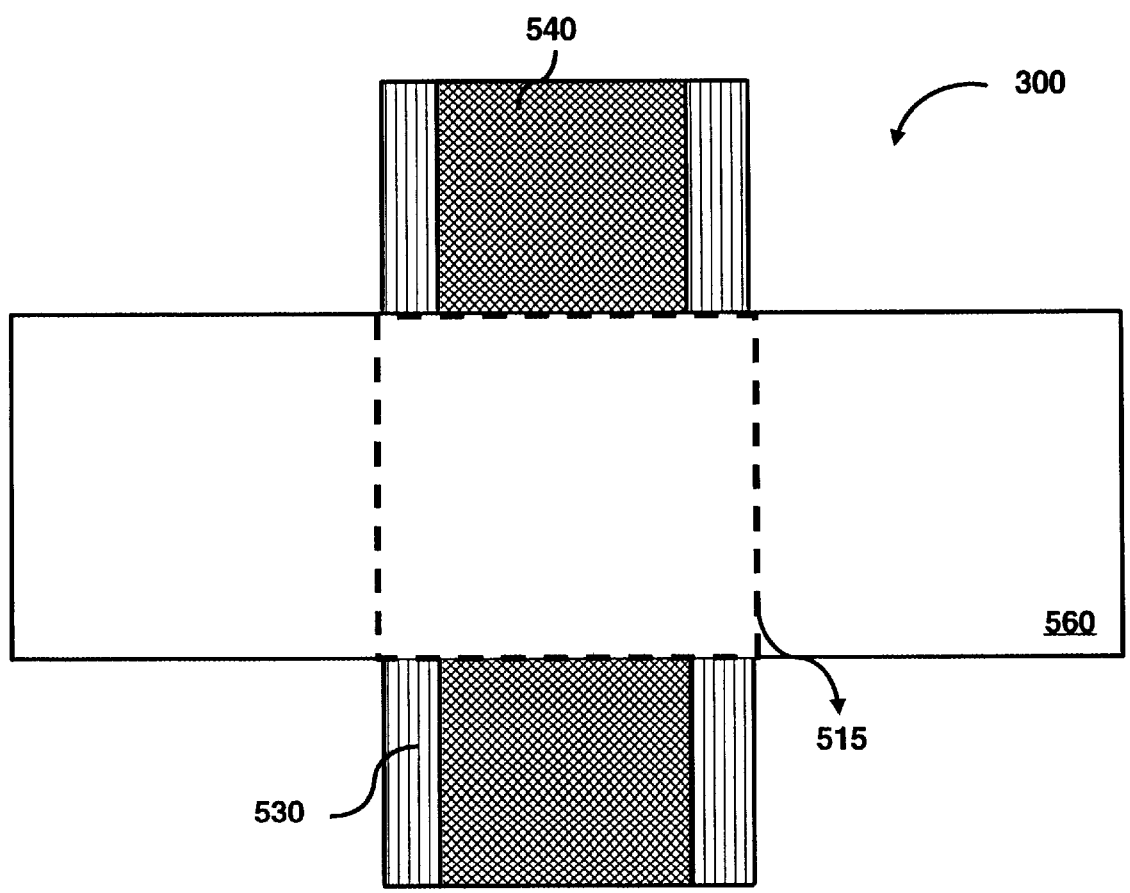
FIG. 5B illustrates a top view the unit memory cell of FIG. 5A showing the cross-point nature of the unit memory cell.
Figure 5C:
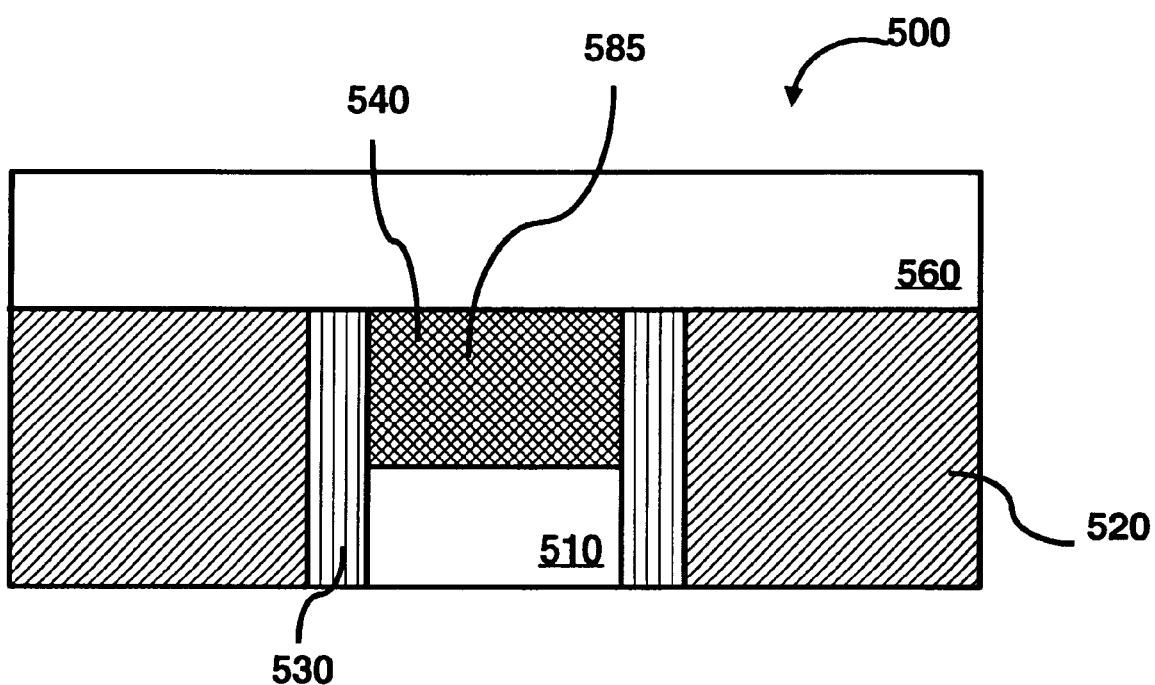
FIG. 5C illustrates a variation on the unit memory cell of FIG. 5A.

FIG. 5B illustrates a top view of the unit memory cell 500 of FIG. 5A. As shown, the row conductor 560 may extend in a row direction. The vertically oriented fuse 530, and thus the 'U' region 585, including the insulating plug 540 and the bottom conductor 510 (both not shown in FIG. 5B) may extend in the column direction and thereby defining a cross-point 515 at the intersection.

Again, while the foregoing descriptions of the memory cell associated FIGS. 5A–5C indicate that the fuse 530, insulating plug 540, and 'U' region 585 extend in a second direction along with the bottom conductor 310, this orientation is not required to practice the present invention. Indeed, the fuse 530 may be associated with the top conductor 360 and extend in a first direction.

FIG. 6A illustrates a simplified three-dimensional perspective of a unit memory cell 600 of a memory array according to an aspect of the invention. As shown, the memory cell 600 includes a row and column conductors 660 and 610. The row and column conductors 660 and 610 may correspond to the top and bottom conductors of unit memory cell embodiments shown in FIGS. 2A–5C. In between the conductors, a state element 692 is formed. The state element 692 may correspond to the first type of unit memory cells as shown in FIGS. 2A–3E or to the second type as shown in FIGS. 4A–5C. For simplicity, insulators that may normally surround the state element 692 are not included in FIG. 6A.

Figure 6C:
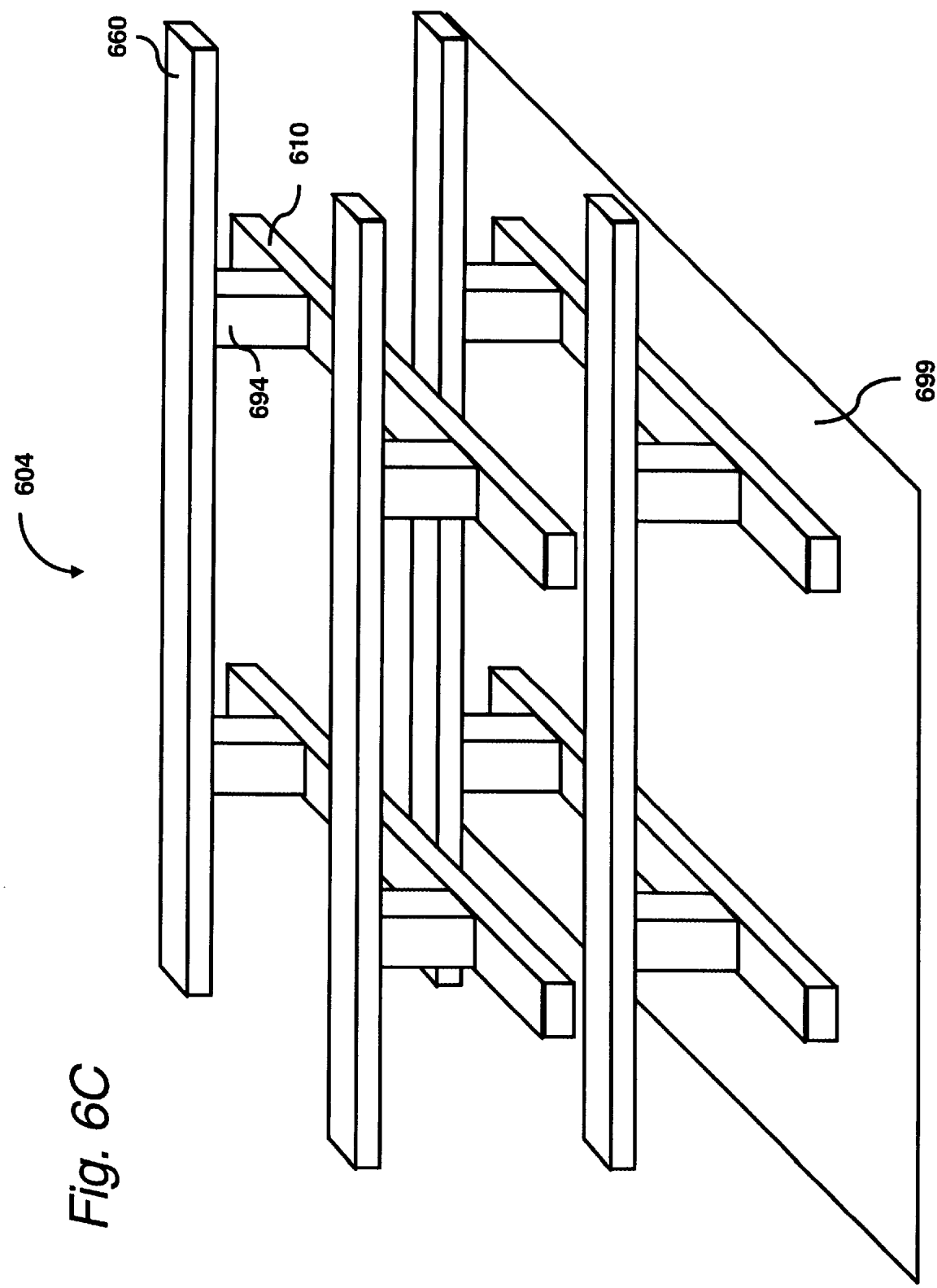

FIGS. 6B–6C illustrate simplified three-dimensional perspectives of stacked memory arrays according to an aspect of the invention. In FIG. 6B, a memory 602 includes a plurality of row conductors 660, a plurality of column conductors 610, and a plurality of state elements 692. Where the row and column conductors 660 and 610 define a cross-point, a state element 692 maybe placed. The entire memory 602 may be placed above a substrate 699.

A memory array may be defined as a plurality of state elements 692 that are all on a same level. The row and column conductors 660 and 610 may also be a part of the memory array. In FIG. 6B, there are three memory arrays stacked on top of one another. However, many levels of memory array may be stacked. Again, insulators that may normally surround the state elements 692 are not included in FIG. 6B for simplicity.

The memory arrays shown in FIG. 6B are stacked such that three memory arrays require four conductor levels. This can be generalized to a memory with N memory arrays requiring N+1 conductor levels. It is also possible to configure the memory arrays such that N memory arrays require 2N conductor levels; for example, in FIG. 6C where two memory arrays and four conductor levels are shown. In this configuration, each memory plane is electrically independent of other memory planes.

Also, while FIG. 6B shows cylindrical state elements 692, FIG. 6C shows a memory 604 with rectangular state elements 694. This is to illustrate that the shape of the state element is not limited to any particular shape.

Figure 6D:
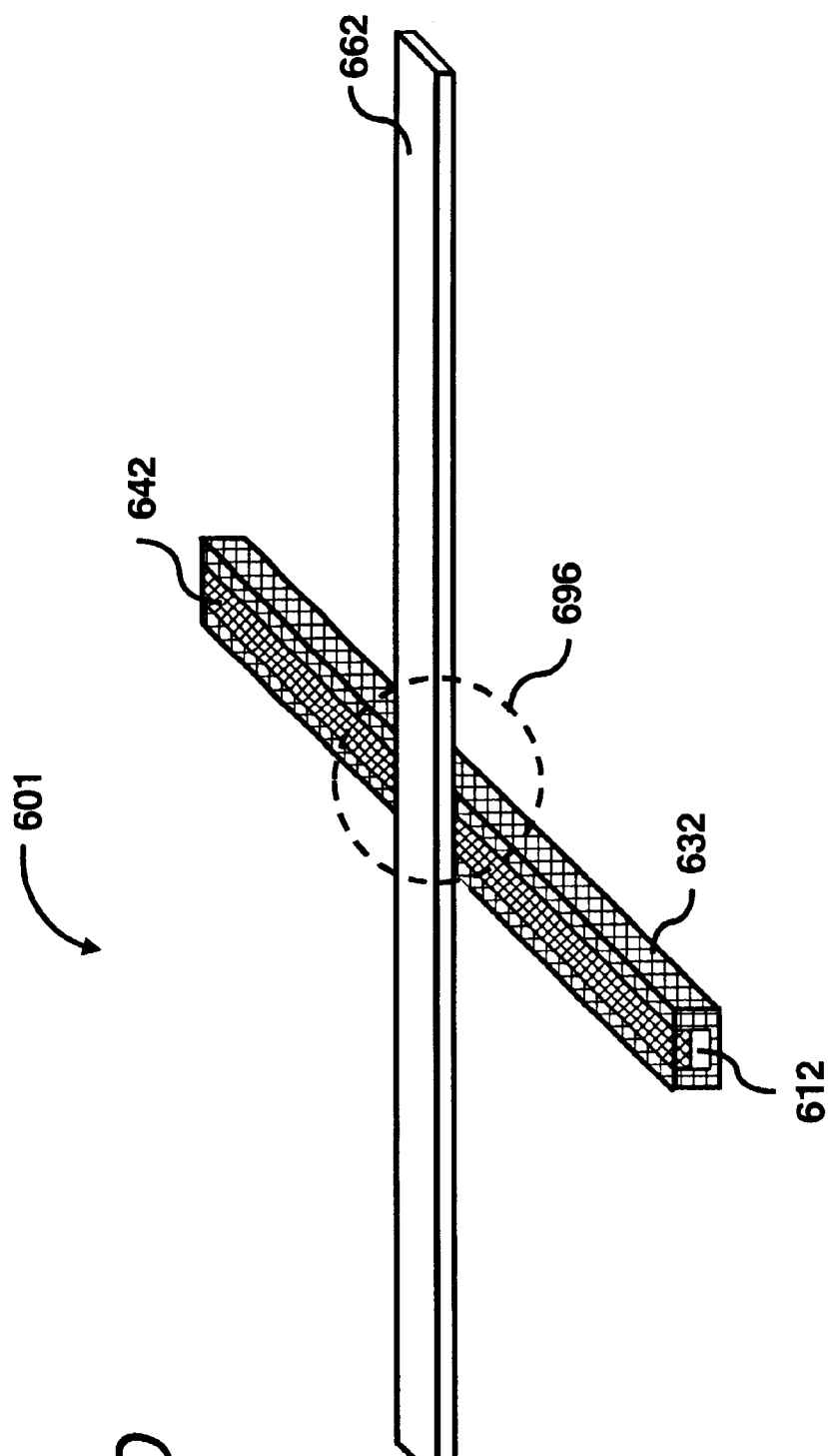
FIG. 6D illustrates a simplified three-dimensional perspective of another unit memory cell of a memory array according to another aspect of the invention.

FIG. 6D illustrates a three-dimensional perspective of the unit memory cell 300 of FIGS. 3A–3E, relabeled as 601 in this figure. As shown, the memory cell 601 includes row and column conductors 662 and 612, a fuse 632, and an insulating plug 642. In this instance, the combination of the fuse 632 and the anti-fuse 682 may comprise a state element 696 at the cross-point of the row and column conductors 662 and 612. If the anti-fuse 682 is removed, FIG. 3D would illustrate a three-dimensional perspective of the unit memory cell 500 of FIGS. 5A–5C. Again for simplicity, insulators that may normally surround the state element 696 are not included in FIG. 6D.

Figure 6E:
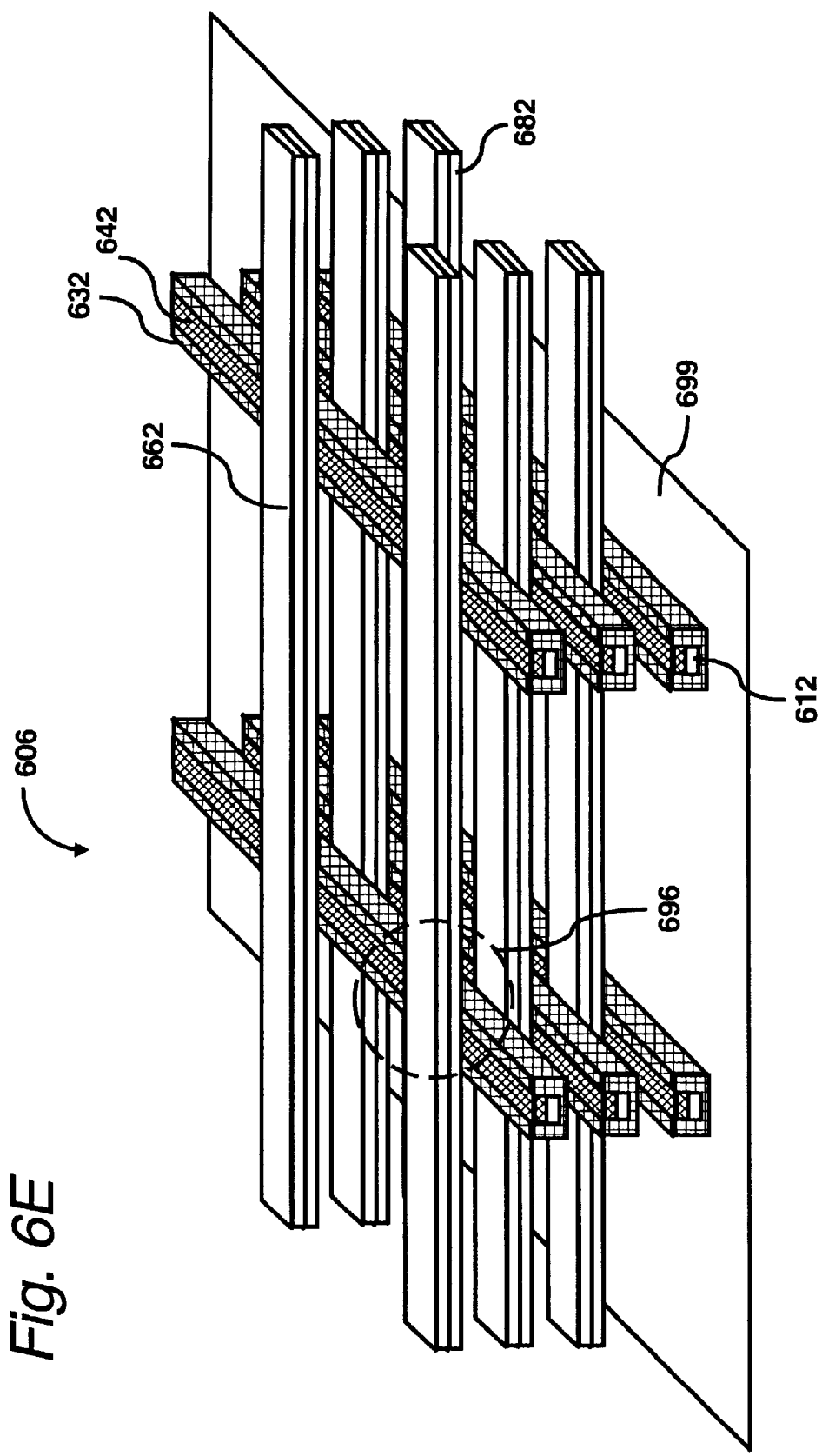
FIG. 6E illustrates a simplified three-dimensional perspectives of stacked memory arrays using the unit memory cell of FIG. 4D according to an aspect of the invention.

FIG. 6E illustrates a simplified three-dimensional perspective of stacked memory arrays according to an aspect of the invention. In FIG. 6E, a memory 606 may include a plurality of row conductors 662, a plurality of column conductors 612, a plurality of fuses 632, and a plurality of insulating plugs 642. Again, the memory 606 may or may not include an anti-fuse 682 at each memory cell 696. The entire memory 606 may be placed above a substrate 699. In FIG. 6E, three levels of memory array are shown, but in reality, many levels of memory array may exist. In the example of FIG. 6E, N layers of memory and 2N layers of conductors are shown. An alternative configuration has N memory layers for N+1 conductor layers.

Figure 7A:
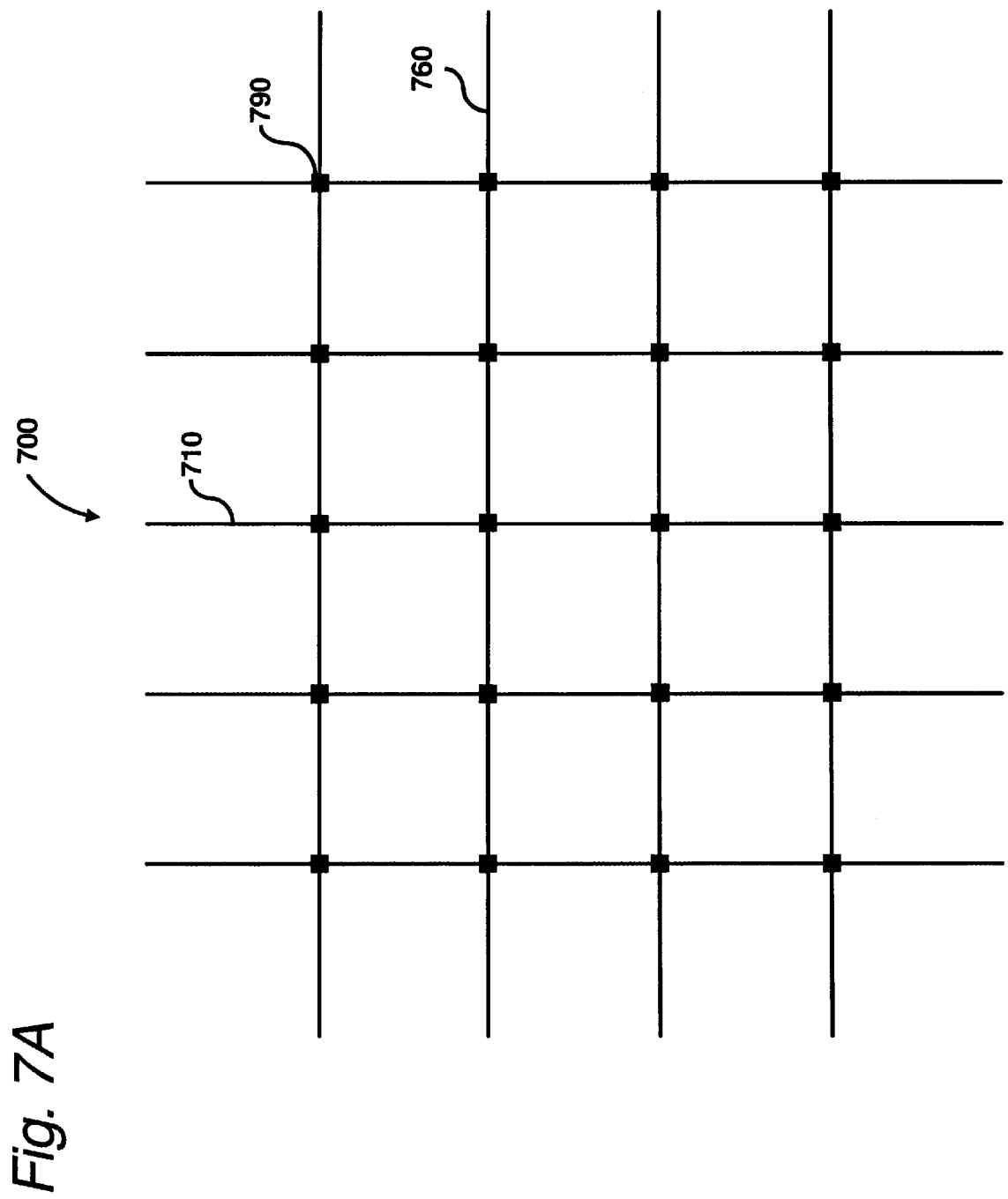
FIG. 7A illustrates a two-dimensional representation of a memory array according to an aspect of the invention.

FIG. 7A illustrates a two-dimensional representation of a memory array 700 according to an aspect of the invention. As shown, the memory array may include one or more row conductors 760 and one or more column conductors 710. At intersections (cross-points) between the row and column conductors 760 and 710, state elements 790 are formed. The state elements 790 may be a first or second type of unit memory cells.

At each cross point, the particular state element 790 may be electrically connected to a particular row conductor 760 and also to a particular column conductor 710. Selecting a particular state element 790 then becomes a simple exercise of activating the particular row and column conductors.

Figure 7B:
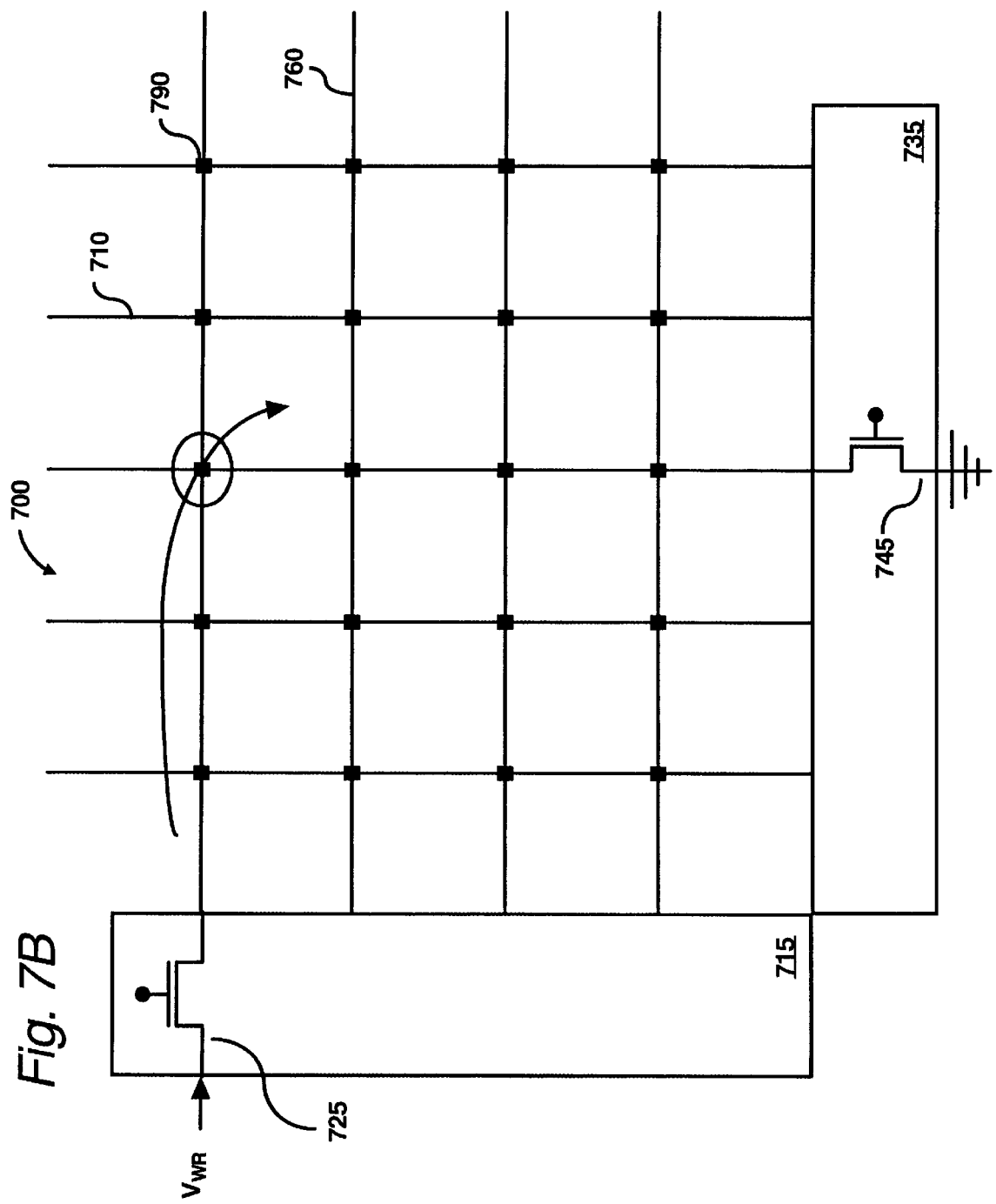
FIGS. 7B and 7C illustrate representations of a memory array for programming and reading, respectively, according to aspects of the invention.
Figure 7C:
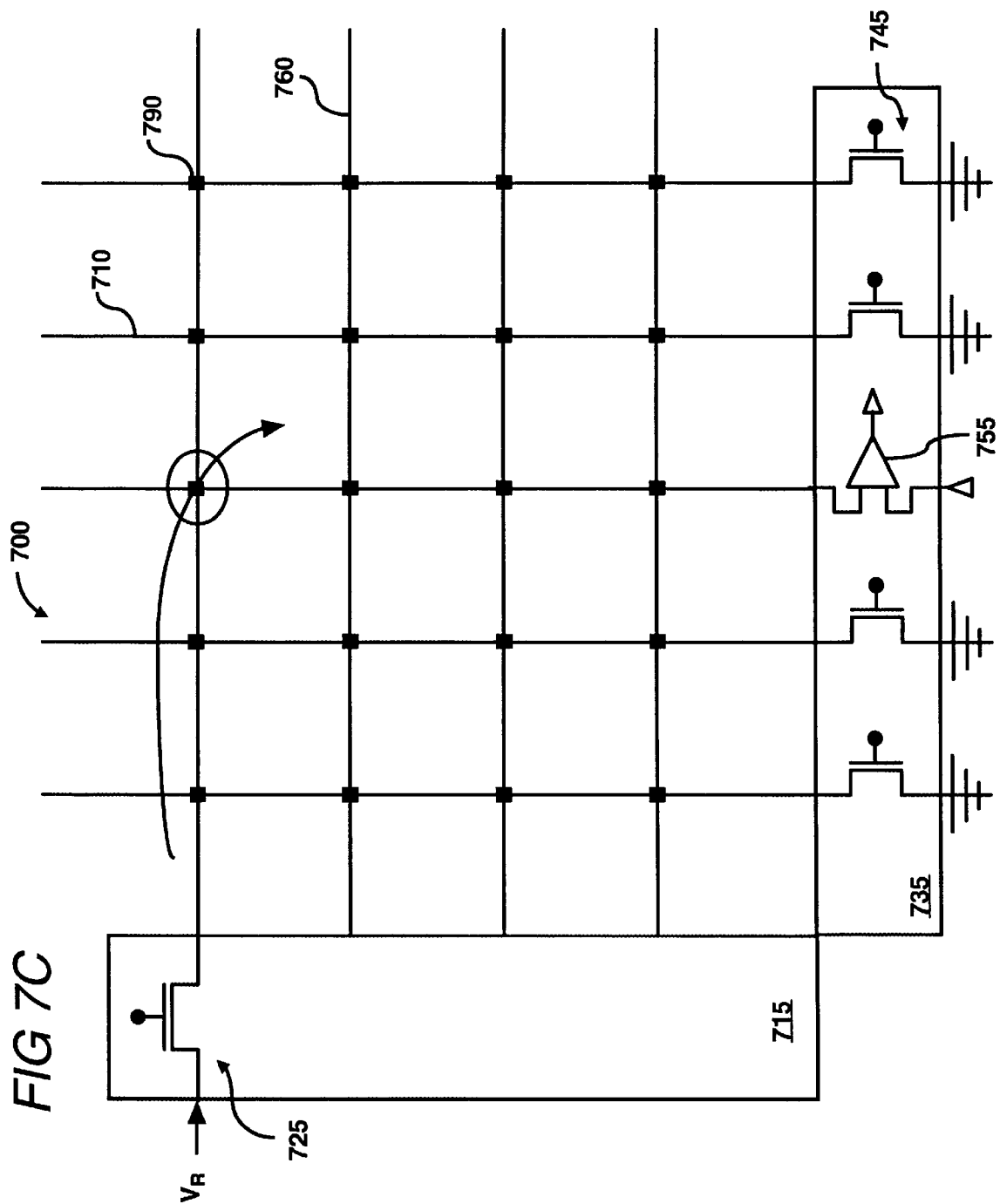

FIGS. 7B and 7C illustrate a representation of a memory array 700 for programming and reading, respectively, according to aspects of the invention. As shown in FIG. 7B, the memory array 700 may further include a row addressing circuit 715 and a column addressing circuit 735. The row addressing circuit 715 may include multiple row transistors 725 where each row conductor 760 is connected to at least one row transistor 725.

The column addressing circuit 735 may include multiple column transistors 745 where each column conductor 710 is connected to at least one column transistor 745. Further, as shown in FIG. 7C, the column addressing circuit 745 may also include multiple current sensors 755 where each column conductor 710 is connected to at least one current sensor 755.

Figure 7D:
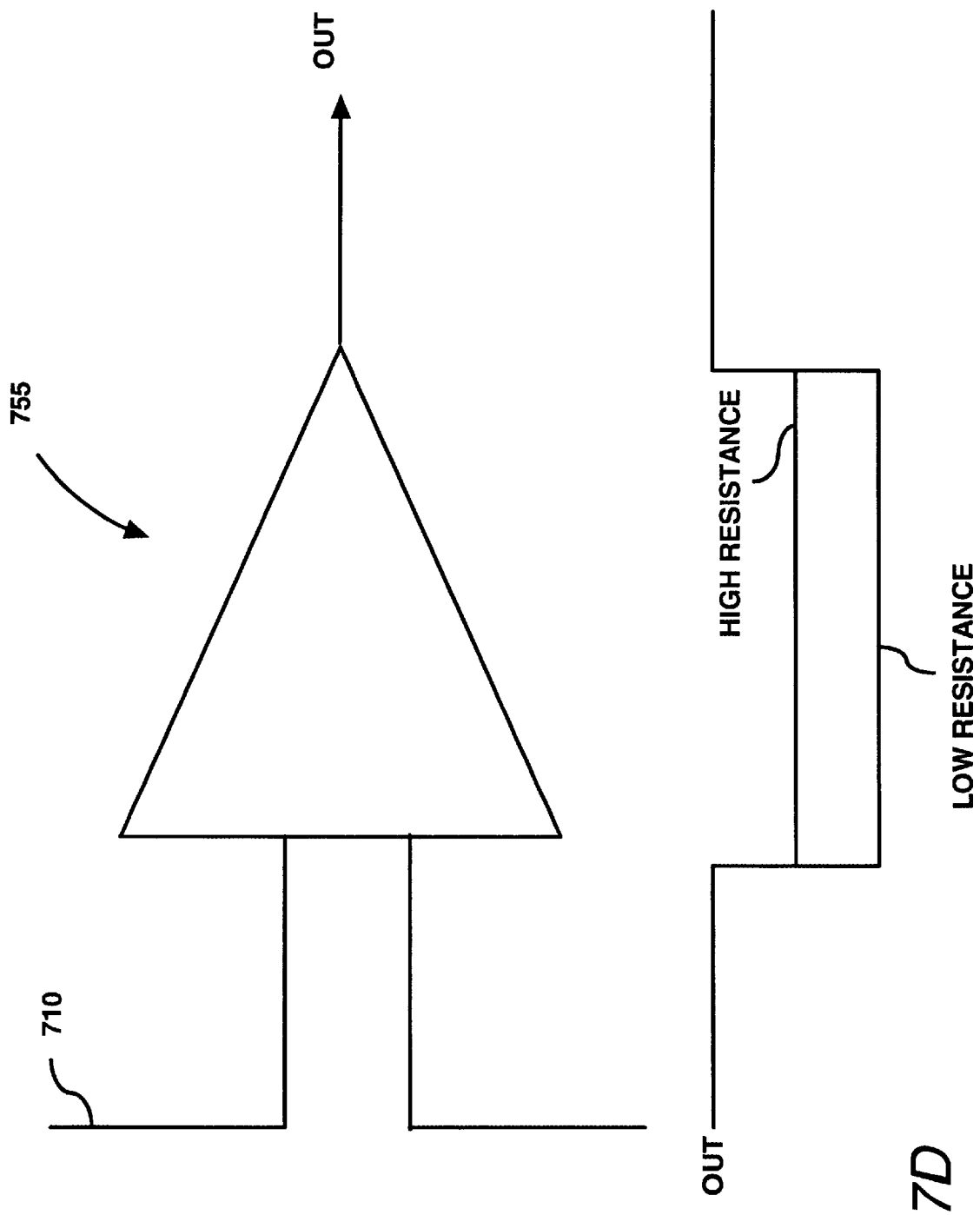
FIG. 7D illustrates a current sensor that utilizes an exemplary equalized potential sensing method to read memory cells according to an aspect of the invention.

With unit memory cells of the first and second types, equipotential sensing may be used to read values of memory cells. FIG. 7D illustrates a current sensor 755 that utilizes equipotential sensing. In a read operation, the magnitude of a sense current from the current sensor 755 indicates the resistance of the state element 790, i.e. the unit memory cell of first or second type, which is then used to determine the logic state of the state element 790.

Referring back to FIG. 7C, during the read operation, a ground potential (or some other common equalized potential) is typically applied to non-selected column conductors 710. The ground potential may be applied using transistors 745 for example. Also, a virtual ground potential is applied to the input of the current sensor 755. In this instance, the selected column conductor 710 could be connected to the input of the current sensor 755. In effect, the potentials of the selected and non-selected column conductors 710 are substantially equalized. This equalization keeps substantially all of the sense current $I_S$ flowing to the current sensor 755. In addition, the equalization substantially blocks the currents from non-selected column conductors from straying into the selected column conductor 710. The blocking minimizes interference with the sensing current $I_S$, which in turn preserves or increases the signal-to-noise ratio during the read operation.

Also, if it is desired to change the amount of sense current $I_S$, the read voltage $V_R$ may be increased or decreased as necessary. The effect is more noticeable for memories using the fuse/anti-fuse combination unit memory cells. It was described above that the resistance of the anti-fuse generally decreases as the voltage across the anti-fuse increases (see FIG. 1D). When it is desired to increase the sense current for example, increasing the voltage across the memory cell results in an increase in current not only due to increased voltage, but also due to the decreased resistance. Thus, a linear increase/decrease in the reading voltage can lead to more than a linear increase/decrease in current. This characteristic can be used to enhance the reading sensitivity of the memory 700.

An additional feature of the voltage dependence of the anti-fuse resistance in a fuse/anti-fuse cross-point memory is that unselected memory cells may have substantially higher resistance than the selected memory cell. As a consequence, the leakage current into the selected column due to current flow through unselected memory cells may be substantially reduced.

Further, while mentioned previously, it is nonetheless worthwhile to note that the cross-point memory array 700 does not require a silicon substrate. This allows many memory array layers to be fabricated on top of each other. The arrays may be connected to CMOS support circuits. The support circuitries include the row and column addressing circuitries 715 and 735, as well as the read and write circuitries (not shown). The support circuits may be fabricated under the cross-point memory array 700. In this manner, the silicon substrate real estate may be more efficiently used and higher memory capacity may be achieved.

Figure 8A:
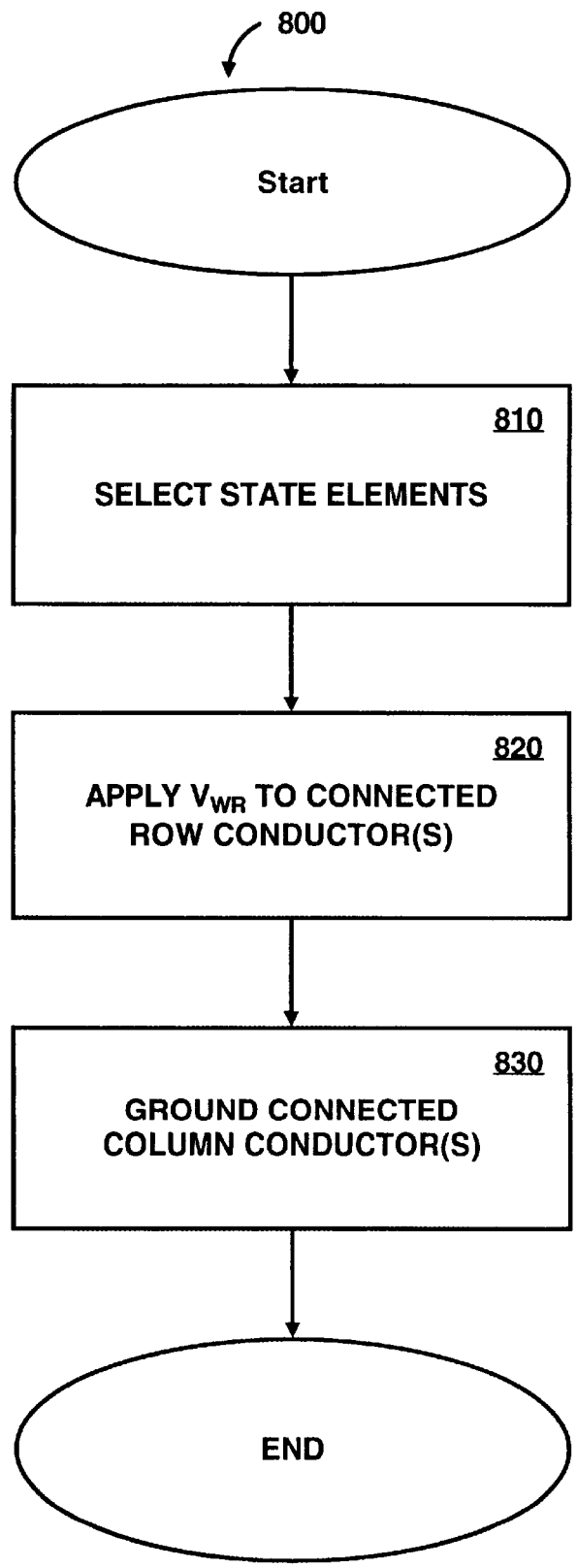
FIGS. 8A and 8B illustrate flow diagrams of methods of programming and reading a memory, respectively, according to an aspect of the invention.
Figure 8B:
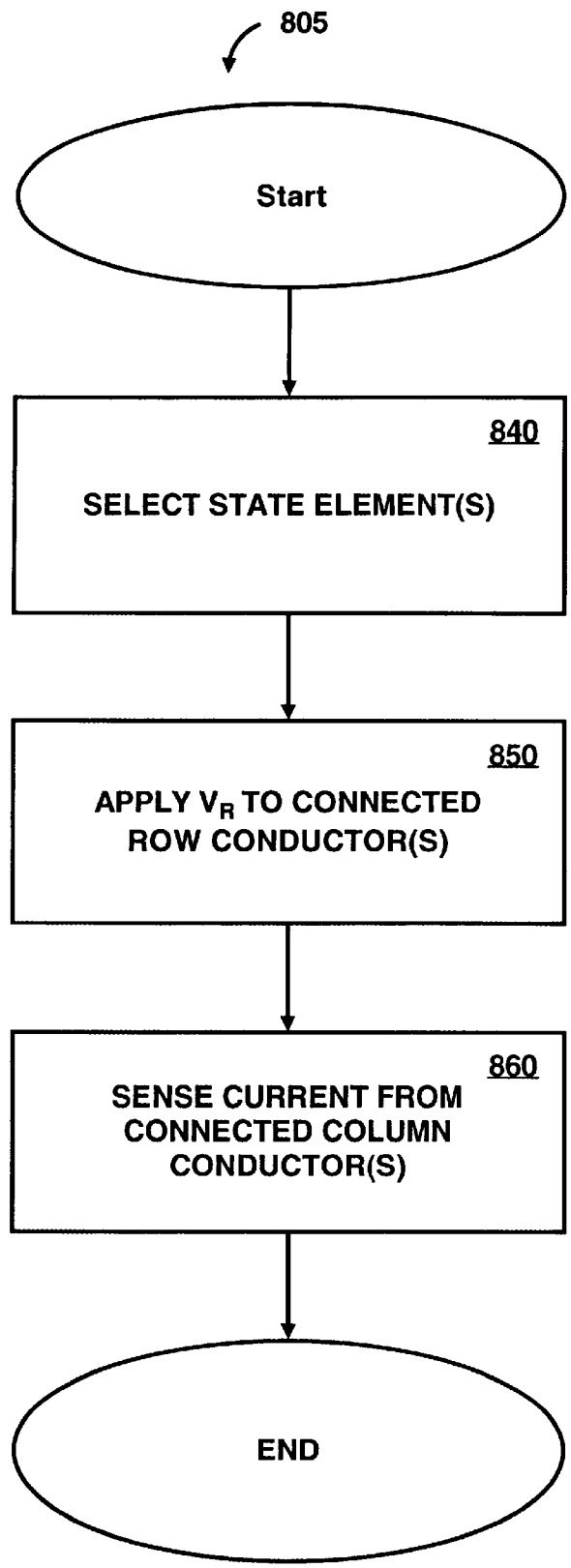

FIGS. 8A and 8B illustrate flow diagrams of methods of programming (800) and reading (805) a memory, respectively, according to an aspect of the invention. As shown in FIG. 8A, when programming the memory device made of memory arrays such as shown in FIG. 7B, one or more state elements 790 are selected (step 810). The programming of a state element 790 may be performed by applying a writing voltage $V_{WR}$ to the connected row conductor 760 (step 820) and grounding the connected column conductor 710 (step 830). The steps 820 and 830 may be performed in opposite order or simultaneously.

An example of the programming method 800 is next described with reference to FIG. 7B. In FIG. 7B, the state element 790 at the intersection of the top row and the third column is selected and the voltage drop occurs across the selected 790. As explained before, the voltage $V_{WR}$ should to be sufficiently large to cause the critical voltage drop to occur across the selected state element 790. The arrow indicates the direction of flow of the sense current Is, which in this case is from the top row conductor 760 to the third column conductor 710.

Note that parallel writing may be possible, i.e., multiple state elements 790 may be selected and programmed by appropriately selecting the row and column conductors and supplying sufficient voltage and current. For example, assume that $V_{WR}$ is applied to first row conductor 760 (as in FIG. 7B). However, in addition to the third column conductor 710, assume also that the fourth column conductor 710 is grounded. Then both the third and fourth state elements 790 of the first row may be programmed simultaneously.

Current may flow through unselected state elements when writing a selected state element. The voltage dependence of the anti-fuse resistance in a fuse/anti-fuse state element may result in a substantially higher resistance for the unselected state elements in comparison to a selected state element. Consequently, leakage current through unselected memory cells may be substantially reduced, thereby reducing the current necessary to program a state element.

As shown in FIG. 8B, when reading the memory device made of memory arrays such as shown in FIG. 7C, one or more state elements 790 are selected (step 840). For each selected state element 790, the reading may be accomplished by applying a reading voltage $V_R$ to the row conductor 760 (step 850) and sensing the amount of current from the column conductor 710 connected to the selected state element 790 (step 860).

An example of the reading method 805 is next described with reference to FIG. 7C. In FIG. 7C, the state element 790 at the intersection of the top row and the third column is selected and the voltage drop occurs across the selected state element 790. The arrow indicates the direction of the current flow, which in this case is from the top row conductor to the third column conductor.

Low resistance and high resistance are two possible states for a state element. The low resistance indicates that the state element 790 has remained in the initial state and the high resistance indicates that the state element 790 has changed to a programmed state. In the extreme case, the initial state may be detected by presence of a current due to a finite resistance (fuse not blown) and the programmed state may be detected by the absence of current due to an open circuit (fuse blown).

Just as in programming, parallel reading is possible, i.e., multiple state elements 790 may be selected and read by appropriately selecting the row and column conductors and sensing the current flow.

While the invention has been described with reference to the exemplary embodiments thereof, those skilled in the art will be able to make various modifications to the described embodiments of the invention without departing from the true spirit and scope of the invention. For example, the terms "row" and "column" are merely relative, and do not imply any fixed orientation. Also, "rows" and "columns" are interchangeable, in that others may refer to "rows" what this document calls columns and vice versa. The terms "row" and "column" do not necessarily imply an orthogonal relationship, although that is what has been illustrated herein. As another example, the term "vertical" is a relative term, assuming that the substrate is horizontal; i.e.— orientation of the substrate may alter the orientation of "vertical" and all such orientations are meant to be captured by that term. The terms and descriptions used herein are set forth by way of illustration only and are not meant as limitations. In particular, although the method of the invention has been described by examples, the steps of the method may be performed in a different order than illustrated or simultaneously. Also, the labels given to the steps of the methods in the claims are for reference purposes only. Unless otherwise specified, the labels given to the steps of the methods do not imply any particular ordering of the steps. Those skilled in the art will recognize that these and other variations are possible within the spirit and scope of the invention as defined in the following claims and their equivalents.

What is claimed is:

1. A one-time programmable memory array, comprising:
  one or more row conductors extending in a row direction;
  one or more column conductors extending in a column direction such that a cross-point is formed at intersections between said row and column conductors; and
  a state element wherein said state element includes a fuse and an anti-fuse in series with each other such that a programmable portion of said fuse lies substantially within an area defined by at least one cross-point, said state element being in electrical contact with said row and column conductors.

2. The memory array of claim 1, further comprising:
an insulator surrounding said state element.

3. The memory array of claim 1, wherein said state element further comprises:
a thin conductor placed in between said fuse and said anti-fuse.

4. The memory array of claim 3, wherein said thin conductor is a first thin conductor, said state element further comprising:
a second thin conductor placed between one of said row and column conductors and said anti-fuse.

5. The memory array of claim 1, wherein said fuse of said state element extends along one of said row and column directions.

6. The memory array of claim 1, wherein said fuse of one or more of said state elements are shaped such that a void exists substantially about a center of said fuse.

7. The memory array of claim 1, wherein said fuse is a vertically oriented fuse such that a ratio of a vertical height to a lateral thickness of said vertically oriented fuse is greater than or substantially equal to one.

8. The memory array of claim 1, wherein a resistance of said anti-fuse varies as voltage across said anti-fuse varies.

9. The memory array of claim 8, wherein said resistance of said anti-fuse decreases as said voltage across said anti-fuse increases.

10. A one-time programmable memory array, comprising:
one or more row conductors extending in a row direction;
one or more column conductors extending in a column direction such that a cross-point is formed at intersections between said row and column conductors; and
a state element wherein said state element includes a vertically oriented fuse such that a programmable portion of said fuse lies substantially within an area defined by at least one cross-point and a ratio of a vertical height to a lateral thickness of said vertically oriented fuse is greater than or substantially equal to one and said state element being in electrical contact with said row and column conductors.

11. The memory array of claim 10, further comprising:
an insulator surrounding said state element.

12. The memory array of claim 10, wherein said vertically oriented fuse of said state element extends along one of said row and column directions.

13. The memory array of claim 10, wherein said vertically oriented fuse of said state element is shaped such that a void exists substantially about a center of said fuse.

14. A one-time programmable memory, comprising:
one or more memory arrays, each memory array comprising:
one or more row conductors extending in a row direction;
one or more column conductors extending in a column direction such that a cross-point is formed at intersections between said row and column conductors; and
a state element wherein said state element includes a fuse and an anti-fuse in series with each other such that a programmable portion of said fuse lies substantially within an area defined by at least one cross-point, said state element being in electrical contact with said row and column conductors;
a row addressing circuit connected to each of said row conductors for selecting a row of said memory array; and
a column addressing circuit connected to each of said column conductors for selecting a column of said memory array.

15. The memory of claim 14, wherein said row and column addressing circuitries associated with said memory array within said memory is at least partially located beneath said memory array.

16. The memory of claim 14, wherein said memory arrays are stacked.

17. The memory of claim 16, wherein a number of row and column conductor layers combined is one greater than a number of said memory arrays.

18. The memory of claim 16, wherein a number of row and column conductor layers combined is twice a number of said memory arrays.

19. The memory of claim 14, wherein said row addressing circuit further comprises:
a row transistor connected to each of said row conductors, wherein each row transistor is used to selectively apply one of a writing voltage and a reading voltage to said connected row conductor.

20. The memory of claim 14, wherein said column addressing circuit further comprises:
a column transistor connected to each of said column conductors, wherein each column transistor is capable of applying an equalized potential to an associated connected column conductor.

21. The memory of claim 20, wherein said column addressing circuit further comprises:
a current sensor connected to each of said column conductors, wherein each current sensor is used to sense a current amount from a selected unit memory cell.

22. The memory of claim 21, wherein said current sensor is capable of applying virtual potential that is substantially equivalent to said equalized potential to an associated column conductor.

23. The memory of claim 22, wherein said equalized potential is ground potential.

24. The memory of claim 14, wherein a resistance of said anti-fuse varies as voltage across said anti-fuse varies.

25. The memory of claim 24, wherein said resistance of said anti-fuse decreases as said voltage across said anti-fuse increases.

26. The memory of claim 14, wherein said fuse is a vertically oriented fuse such that a ratio of a vertical height to a lateral thickness of said vertically oriented fuse is greater than or substantially equal to one.

27. The memory of claim 14, wherein said state element further comprises:
a thin conductor placed in between said fuse and said anti-fuse.

28. The memory of claim 27, wherein said thin conductor is a first thin conductor, said state element further comprising:
a second thin conductor placed between one of said row and column conductors and said anti-fuse.

29. A one-time programmable memory, comprising:
one or more memory arrays, each memory array comprising:
one or more row conductors extending in a row direction;
one or more column conductors extending in a column direction such that a cross-point is formed at intersections between said row and column conductors; and
a state element wherein said state element includes a vertically oriented fuse such that a programmable portion of said vertically oriented fuse lies substantially within an area defined by at least one cross-point and a ratio of a vertical height to a lateral thickness of said vertically oriented fuse is greater than or substantially equal to one, said state element being in electrical contact with said row and column conductors;

a row addressing circuit connected to each of said row conductors for selecting a row of said memory array; and a column addressing circuit connected to each of said column conductors for selecting a column of said memory array.

30. The memory of claim 29, wherein said row and column addressing circuitries associated with said memory array within said memory is at least partially located beneath said memory array.

31. The memory of claim 29, wherein said memory arrays are stacked.

32. The memory of claim 31, wherein a number of row and column conductor layers combined is one of:

one greater than a number of said memory arrays; and twice a number of said memory arrays.

33. The memory of claim 29, wherein:

said row addressing circuit further comprises a row transistor connected to each of said row conductors, wherein each row transistor is used to selectively apply one of a writing voltage and a reading voltage to said connected row conductor; and said column addressing circuit further comprises a column transistor connected to each of said column conductors, wherein each column transistor is capable of applying an equalized potential to an associated connected column conductor.

34. The memory of claim 33, wherein said column addressing circuit further comprises a current sensor connected to each of said column conductors, wherein each current sensor is used to sense a current amount from a selected unit memory cell.

35. The memory of claim 34, wherein said current sensor is capable of applying virtual potential that is substantially equivalent to said equalized potential to an associated column conductor.

* * * * *